(12) United States Patent
Wakata et al.

(10) Patent No.: US 8,952,767 B2
(45) Date of Patent: Feb. 10, 2015

(54) LAYERED BANDPASS FILTER

(75) Inventors: Eiko Wakata, Tokyo (JP); Shigemitsu Tomaki, Tokyo (JP); Isao Abe, Tokyo (JP)

(73) Assignee: TDK Corporation, Tokyo (JP)

( * ) Notice: Subject to any disclaimer, the term of this patent is extended or adjusted under 35 U.S.C. 154(b) by 409 days.

(21) Appl. No.: 13/429,982

(22) Filed: Mar. 26, 2012

(65) Prior Publication Data

US 2012/0249264 A1 Oct. 4, 2012

(30) Foreign Application Priority Data

Mar. 30, 2011 (JP) ................. 2011-073970

(51) Int. Cl.
*H03H 7/12* (2006.01)
*H01P 1/203* (2006.01)
*H03H 1/00* (2006.01)

(52) U.S. Cl.
CPC ............. *H01P 1/20345* (2013.01); *H03H 7/12* (2013.01); *H03H 2001/0085* (2013.01)
USPC ........................................ 333/185; 333/175

(58) Field of Classification Search
CPC ..................... H03H 2001/0085; H03H 7/0015; H03H 7/12; H03H 7/0161; H03H 1/20345
USPC .................................................. 333/175, 185
See application file for complete search history.

(56) References Cited

U.S. PATENT DOCUMENTS

| 5,945,892 A | 8/1999 | Kato et al. |
| 2010/0171568 A1* | 7/2010 | Taniguchi ..................... 333/176 |

* cited by examiner

*Primary Examiner* — Benny Lee
*Assistant Examiner* — Rakesh Patel
(74) *Attorney, Agent, or Firm* — Oliff PLC

(57) ABSTRACT

A bandpass filter includes a layered structure including a plurality of stacked dielectric layers, and first to third resonators provided within the layered structure. In terms of circuit configuration, the second resonator is located between the first and third resonators. The first resonator includes a first inductor and a first capacitor. The second resonator includes a second inductor and a second capacitor. The third resonator includes a third inductor and a third capacitor. The second inductor is disposed at a position different from that of each of the first and third inductors in the stacking direction of the dielectric layers. The second inductor is lower in inductance than the first and third inductors. The second capacitor is higher in capacitance than the first and third capacitors.

7 Claims, 17 Drawing Sheets

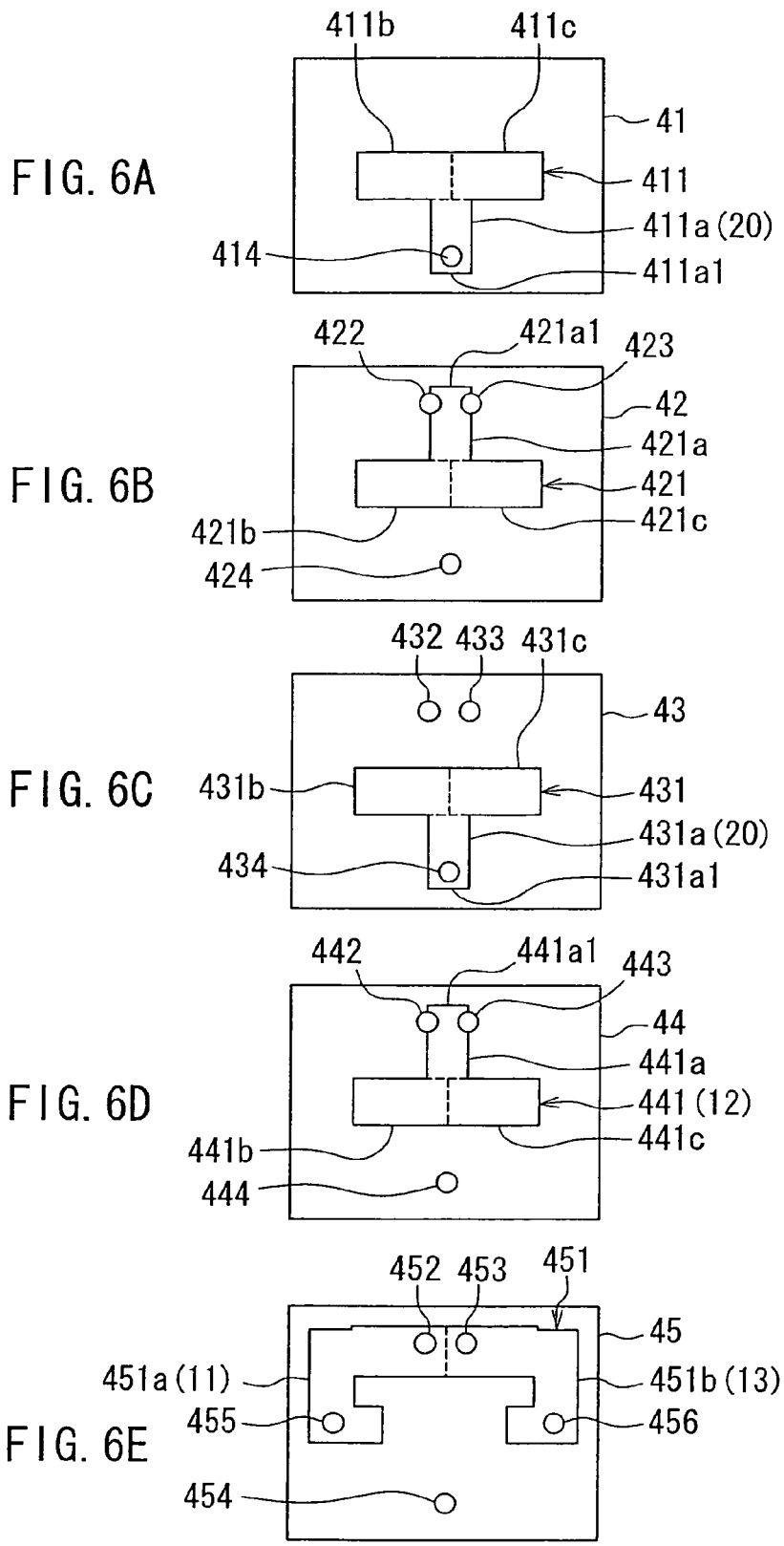

LAYERED BANDPASS FILTER

BACKGROUND OF THE INVENTION

1. Field of the Invention

The present invention relates to a layered bandpass filter including three or more resonators that are provided within a layered structure including a plurality of stacked dielectric layers.

2. Description of the Related Art

Today's compact wireless communication apparatuses such as cellular phones increasingly incorporate, in addition to primary wireless communication devices, other communication devices such as those compatible with Bluetooth® standards or those for wireless LANs (local area networks). Thus, there are strong demands for reductions in size and thickness of the communication devices incorporated in the compact wireless communication apparatuses, and accordingly, reductions in size and thickness are also demanded for electronic components for use in such communication devices. The electronic components are also required to be reduced in footprint. To reduce the footprints of the electronic components, it is effective to employ, as the terminal structure of the electronic components, a bottom surface terminal structure such as the land grid array (LGA).

One of the electronic components for communication devices is a bandpass filter for filtering transmission and reception signals. Bandpass filters are also required to be reduced in size, thickness, and footprint. Known as a bandpass filter that is responsive to service frequency bands for various types of communication devices and can be reduced in size and thickness is a layered bandpass filter including a plurality of resonators provided within a layered structure having a plurality of stacked dielectric layers. In the layered bandpass filter, two adjacent resonators are electromagnetically coupled to each other. The electromagnetic coupling includes inductive coupling and capacitive coupling.

Among resonators for use in the layered bandpass filter, well-known is an LC resonator having an inductor formed using a conductor layer such as a strip line. Also known as the LC resonator is the one in which an inductor composed of through holes is connected perpendicular to a conductor layer for a capacitor, as disclosed in U.S. Pat. No. 5,945,892.

The layered bandpass filter has a problem that as the size and thickness of the bandpass filter are reduced, inductive coupling between adjacent resonators may be excessively enhanced to make it difficult to achieve desired characteristics of the bandpass filter.

In the case of the layered bandpass filter in which each resonator is an LC resonator having an inductor formed using a conductor layer, an attempt to reduce the size and thickness of the bandpass filter should result in a reduction in the distance between the conductor layer for the inductor and another conductor layer for a capacitor or the ground This will raise the problem that the magnetic field produced from the conductor layer for the inductor and contributing to inductive coupling between two adjacent resonators is hindered by the other conductor layer, so that the resonators suffer degradation in Q.

The LC resonator having an inductor composed of through holes can provide an enhanced Q because the magnetic field produced from the inductor will be less hindered by other conductor layers. However, when the LC resonator is used for the layered bandpass filter while an attempt is made to reduce the layered bandpass filter in thickness, there is a problem that the through holes constituting the inductor are reduced in length to decrease the inductance of the inductor, thereby causing the resonator to become unable to provide a desired resonant frequency.

OBJECT AND SUMMARY OF THE INVENTION

It is an object of the present invention to provide a layered bandpass filter that achieves a reduction in size while preventing degradation of resonator Q.

A layered bandpass filter of the present invention includes: a layered structure including a plurality of dielectric layers that are stacked; an input terminal and an output terminal disposed on a periphery of the layered structure; and a first resonator, a second resonator, and a third resonator provided within the layered structure. Of the first to third resonators, the first resonator is located closest to the input terminal, the third resonator is located closest to the output terminal, and the second resonator is located between the first resonator and the third resonator, in terms of circuit configuration. The first resonator includes a first inductor and a first capacitor. The second resonator includes a second inductor and a second capacitor. The third resonator includes a third inductor and a third capacitor. It should be noted that the phrase "in terms of circuit configuration" used herein is intended to mean positioning in a schematic circuit diagram, not in the physical configuration.

The second inductor is disposed at a position different from that of each of the first and third inductors in the stacking direction of the plurality of dielectric layers. No conductor layer is present between the second inductor and the first inductor and between the second inductor and the third inductor. The first to third capacitors are disposed at positions different from those of the first to third inductors in the stacking direction. The second inductor is lower in inductance than the first and third inductors. The second capacitor is higher in capacitance than the first and third capacitors.

In the layered bandpass filter of the present invention, the first and third inductors may be disposed on the same one of the plurality of dielectric layers.

In the layered bandpass filter of the present invention, the second inductor may include a first portion, and a second portion and a third portion connected to the first portion. Part of the second portion may be opposed to part of the first inductor. Part of the third portion may be opposed to part of the third inductor.

In the layered bandpass filter of the present invention, the second capacitor may be formed using three or more conductor layers that are disposed at different positions in the stacking direction.

In the layered bandpass filter of the present invention, the second resonator may further include a fourth inductor connected to the second capacitor in series.

The layered bandpass filter of the present invention may further include a ground terminal disposed on one of end faces of the layered structure in the stacking direction, and a common conductive path for electrically connecting the first to third inductors to the ground terminal. The common conductive path may be formed using through holes or using a conductor layer disposed on the periphery of the layered structure.

According to the layered bandpass filter of the present invention, the second inductor can be shaped into a smaller size since the second inductor is lower in inductance than the first and third inductors. This allows a reduction in size of the layered bandpass filter. The layered bandpass filter of the present invention is configured not only so that the second inductor is lower in inductance than the first and third inductors as mentioned above but also that the second capacitor is higher in capacitance than the first and third capacitors. This makes it possible to allow the second resonator to provide a desired resonant frequency.

Furthermore, according to the present invention, since the second inductor is lower in inductance than the first and third inductors, it is possible to prevent the inductive coupling between the second inductor and the first inductor and the inductive coupling between the second inductor and the third inductor from being excessively enhanced even when the second inductor and the first inductor are located close to each other and the second inductor and the third inductor are located close to each other. This allows the layered bandpass filter to be reduced in size.

In the present invention, no conductor layer is present between the second inductor and the first inductor and between the second inductor and the third inductor. This makes it possible to prevent the first to third resonators from being degraded in Q.

As can be seen from the foregoing, the layered bandpass filter of the present invention achieves a size reduction while preventing degradation of resonator Q.

Other and further objects, features and advantages of the invention will appear more fully from the following description.

BRIEF DESCRIPTION OF THE DRAWINGS

FIG. 6A to FIG. 6E are explanatory diagrams showing the top surfaces of the first to fifth dielectric layers of the layered structure of the bandpass filter according to the first embodiment of the invention.

DETAILED DESCRIPTION OF THE PREFERRED EMBODIMENTS

[First Embodiment]

Figure 1:
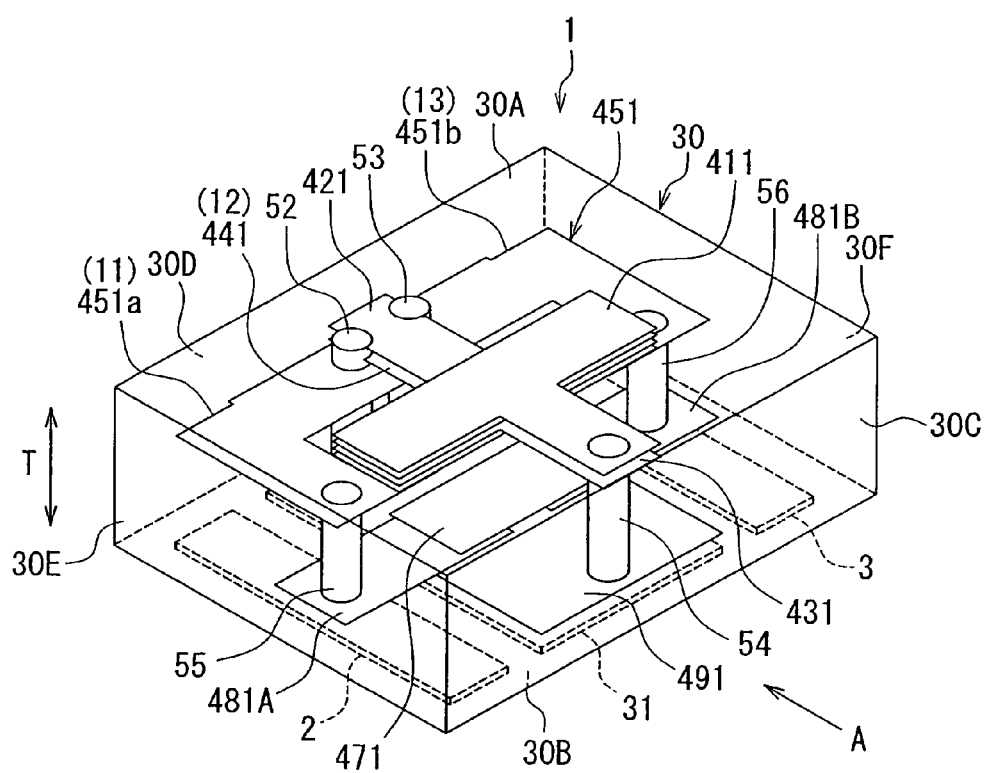
FIG. 1 is a perspective view showing the main part of a bandpass filter according to a first embodiment of the invention.

Preferred embodiments of the present invention will now be described in detail with reference to the drawings. First, reference is made to FIG. 5 to describe the circuit configuration of a layered bandpass filter according to a first embodiment of the invention. The layered bandpass filter (hereinafter simply referred to as the bandpass filter) 1 according to the present embodiment includes an input terminal 2, an output terminal 3, a first resonator 4, a second resonator 5, a third resonator 6, and three capacitors 17, 18, and 19.

The input terminal 2 is for receiving signals. The output terminal 3 is for outputting the signals. Of the resonators 4, 5, and 6, the resonator 4 is located closest to the input terminal 2, the resonator 6 is located closest to the output terminal 3, and the resonator 5 is located between the resonator 4 and the resonator 6, in terms of circuit configuration. In the present embodiment, in particular, the resonator 4 is electrically connected to the input terminal 2 while the resonator 6 is electrically connected to the output terminal 3. The resonators 4 and 5 are adjacent to each other and electromagnetically coupled to each other. The resonators 5 and 6 are adjacent to each other and electromagnetically coupled to each other. The electromagnetic coupling includes inductive coupling and capacitive coupling.

Figure 5:
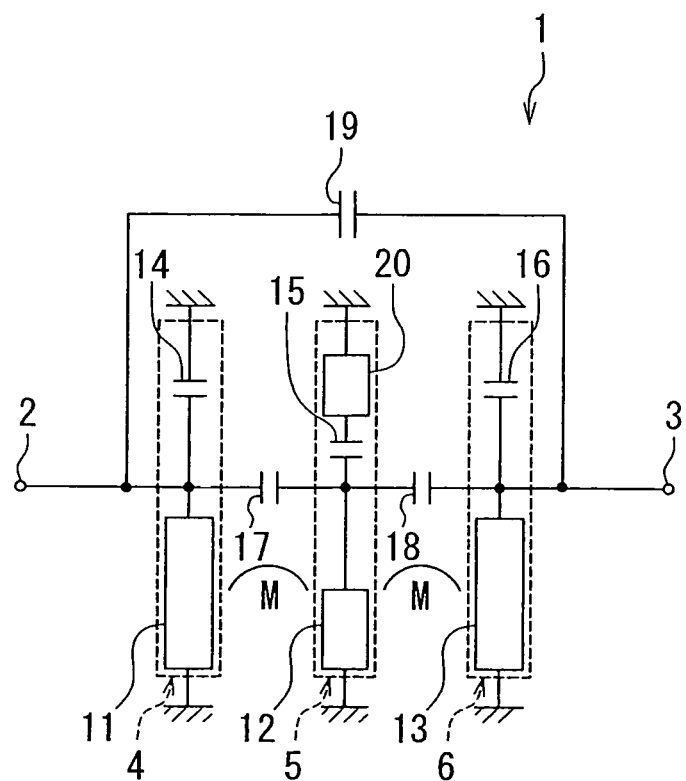
FIG. 5 is a circuit diagram showing the circuit configuration of the bandpass filter according to the first embodiment of the invention.

The first resonator 4 includes a first inductor 11 and a first capacitor 14 electrically connected to each other. The second resonator 5 includes a second inductor 12 and a second capacitor 15 electrically connected to each other. The third resonator 6 includes a third inductor 13 and a third capacitor 16 electrically connected to each other. The second resonator 5 further includes a fourth inductor 20 connected to the second capacitor 15 in series. The inductors 11 and 12 are inductively coupled to each other. Likewise, the inductors 12 and 13 are inductively coupled to each other. In FIG. 5, the inductive coupling between the inductors 11 and 12 and the inductive coupling between the inductors 12 and 13 are shown with curves M.

One end of the inductor 11 and one end of each of the capacitors 14, 17, and 19 are electrically connected to the input terminal 2. The other end of the inductor 11 and the other end of the capacitor 14 are electrically connected to the ground. One end of the inductor 12 and one end of each of the capacitors 15 and 18 are electrically connected to the other end of the capacitor 17. The other end of the inductor 12 is electrically connected to the ground. One end of the inductor 20 is electrically connected to the other end of the capacitor 15. The other end of the inductor 20 is electrically connected to the ground. One end of the inductor 13, one end of the capacitor 16, the other end of the capacitor 19, and the output terminal 3 are electrically connected to the other end of the capacitor 18. The other end of the inductor 13 and the other end of the capacitor 16 are electrically connected to the ground.

The resonator 5 is inductively coupled to the resonator 4 by the inductive coupling between the inductors 11 and 12, and is capacitively coupled to the resonator 4 via the capacitor 17. The resonator 5 is also inductively coupled to the resonator 6 by the inductive coupling between the inductors 12 and 13, and is capacitively coupled to the resonator 6 via the capacitor 18. The two non-adjacent resonators 4 and 6 are capacitively coupled to each other via the capacitor 19.

The resonators 4, 5 and 6 are quarter-wave resonators each having an open end and a short-circuited end. These quarter-wave resonators take advantage of making the physical lengths of the inductors 11, 12 and 13 shorter than one-quarter wavelength by using the capacitors 14, 15 and 16, respectively. In the resonator 4, the connection point between the inductor 11 and the capacitor 14 is the open end, and the respective ends of the inductor 11 and the capacitor 14 closer to the ground constitute the short-circuited end. In the resonator 5, the connection point between the inductor 12 and the capacitor 15 is the open end, and the respective ends of the inductor 12 and the inductor 20 closer to the ground constitute the short-circuited end. In the resonator 6, the connection point between the inductor 13 and the capacitor 16 is the open end, and the respective ends of the inductor 13 and the capacitor 16 closer to the ground constitute the short-circuited end.

The inductance of the inductor 11 and the capacitance of the capacitor 14 are determined so that the resonator 4 can provide a desired resonant frequency. The inductances of the inductors 12 and 20 and the capacitance of the capacitor 15 are determined so that the resonator 5 can provide a desired resonant frequency. The inductance of the inductor 13 and the capacitance of the capacitor 16 are determined so that the resonator 6 can provide a desired resonant frequency.

The second inductor 12 is lower in inductance than the first inductor 11 and the third inductor 13. The second capacitor 15 is higher in capacitance than the first capacitor 14 and the third capacitor 16. The inductances of the inductors 11 and 13 may be equal. The capacitances of the capacitors 14 and 16 may be equal. The fourth inductor 20 functions to reduce the capacitance of the second capacitor 15 needed to achieve the desired resonant frequency of the resonator 5 to a smaller value when compared with the case of the absence of the inductor 20. Note that the resonator 5 may be without the inductor 20. In this case, in the resonator 5, the respective ends of the inductor 12 and the capacitor 15 closer to the ground constitute the short-circuited end.

The bandpass filter 1 according to the present embodiment is configured so that when signals are input to the input terminal 2, those of the signals at frequencies within a predetermined passband are selectively output from the output terminal 3.

Figure 2:
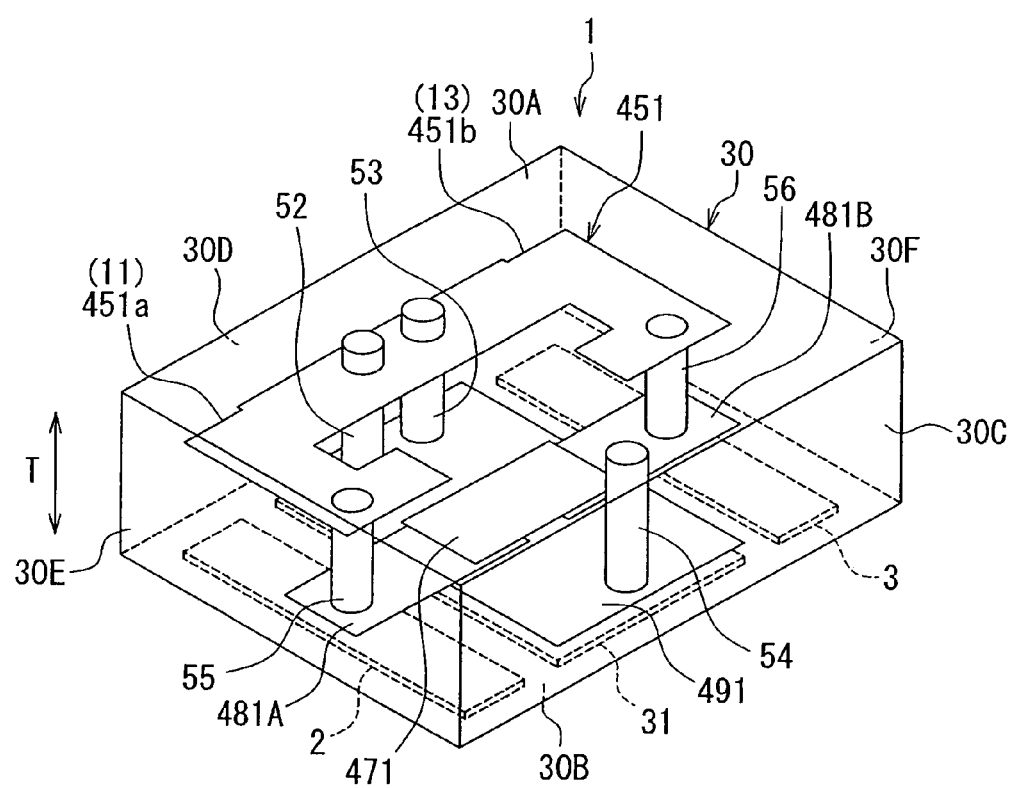
FIG. 2 is a partial perspective view of the bandpass filter according to the first embodiment of the invention.
Figure 3:
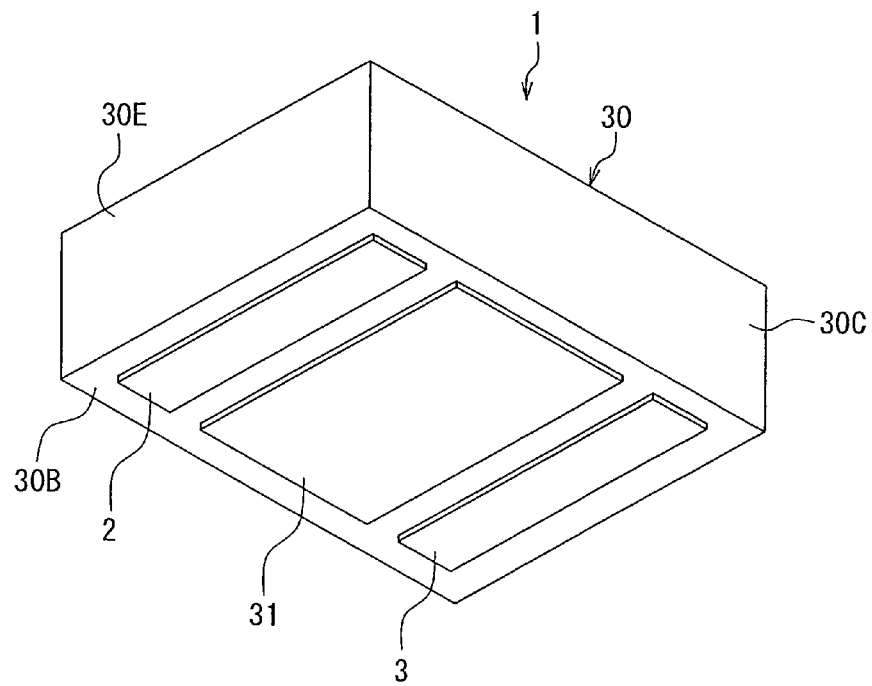
FIG. 3 is a perspective view of the bandpass filter according to the first embodiment of the invention as viewed from below.
Figure 4:
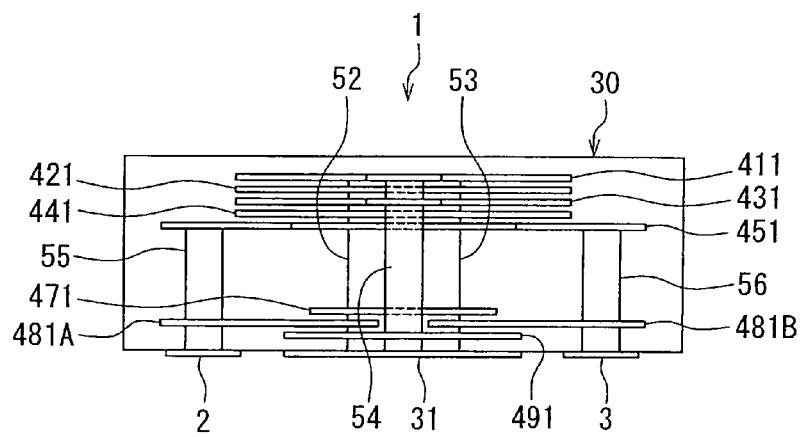
FIG. 4 is an explanatory diagram showing the main part of the bandpass filter as viewed from direction A of FIG. 1.

The outline of the structure of the bandpass filter 1 will be described with reference to FIG. 1 to FIG. 4. FIG. 1 is a perspective view showing the main part of the bandpass filter 1. FIG. 2 is a partial perspective view of the bandpass filter 1. FIG. 3 is a perspective view of the bandpass filter 1 as viewed from below. FIG. 4 is an explanatory diagram showing the main part of the bandpass filter 1 as viewed in direction A of FIG. 1. The bandpass filter 1 includes a layered structure 30 for uniting the components of the bandpass filter 1. As will be described in detail later, the layered structure 30 includes a plurality of dielectric layers and a plurality of conductor layers that are stacked. The resonators 4, 5, and 6 are provided within the layered structure 30.

The layered structure 30 is in shape of a rectangular solid and has a periphery. The periphery of the layered structure 30 includes a top surface 30A, a bottom surface 30B, and four side surfaces 30C to 30F. The top surface 30A and the bottom surface 30B are opposite each other. The side surfaces 30C and 30D are opposite each other. The side surfaces 30E and 30F are opposite each other. The side surfaces 30C to 30F are perpendicular to the top surface 30A and the bottom surface 30B. In the layered structure 30, the direction perpendicular to the top surface 30A and the bottom surface 30B is the stacking direction of the plurality of dielectric layers and the plurality of conductor layers. In FIG. 1 and FIG. 2, the stacking direction is shown by the arrow with the symbol T. The top surface 30A and the bottom surface 30B are end faces of the layered structure 30 that are opposite to each other in the stacking direction T. The bottom surface 30B corresponds to the "one of end faces of the layered structure in the stacking direction" according to the invention.

The bandpass filter 1 further includes a ground terminal 31 disposed on the bottom surface 30B of the layered structure 30. The input terminal 2 and the output terminal 3 are disposed on the bottom surface 30B such that the ground terminal 31 is interposed between the input terminal 2 and the output terminal 3. An input conductor layer, an output conductor layer, and a ground conductor layer are formed on the top surface of a mounting board on which the bandpass filter 1 is mounted. The bandpass filter 1 is mounted on the mounting board with the bottom surface 30B toward the top surface of the mounting board so that the input terminal 2 is electrically connected to the input conductor layer, the output terminal 3 is electrically connected to the output conductor layer, and the ground terminal 31 is electrically connected to the ground conductor layer. The input conductor layer conveys an input signal to be input to the input terminal 2. The output conductor layer conveys an output signal output from the output terminal 3. The ground conductor layer is electrically connected to the ground.

The layered structure 30 will now be described in detail with reference to FIG. 6A to FIG. 6E and FIG. 7A to FIG. 7E. FIG. 6A to FIG. 6E show the top surfaces of first to fifth dielectric layers of the layered structure 30, respectively. FIG. 7A to FIG. 7E show the top surfaces of sixth to ninth dielectric layers and the bottom surface of a tenth dielectric layer of the layered structure 30, respectively. In the layered structure 30, the first to tenth dielectric layers are arranged in this order from the top.

A conductor layer 411 is formed on the top surface of the first dielectric layer 41 shown in FIG. 6A. In the layered structure 30, although not illustrated, a dielectric layer without any conductor layer formed thereon is disposed on the dielectric layer 41. The conductor layer 411 includes a first portion 411a, and a second portion 411b and a third portion 411c connected to the first portion 411a. The portions 411a, 411b, and 411c are each elongated in one direction. The portions 411a, 411b, and 411c are connected to each other at the center of the top surface of the dielectric layer 41. In FIG. 6A, the boundaries between the portions 411a, 411b, and 411c are shown by broken lines. The first portion 411a extends downward in FIG. 6A from the center of the top surface of the dielectric layer 41, and has a lower end 411a1. The second portion 411b extends leftward in FIG. 6A from the center of the top surface of the dielectric layer 41. The third portion 411c extends rightward in FIG. 6A from the center of the top surface of the dielectric layer 41. The conductor layer 411 is T-shaped as a whole. The dielectric layer 41 is provided with a through hole 414 located near the lower end 411a1 and electrically connected to the first portion 411a.

A conductor layer 421 is formed on the top surface of the second dielectric layer 42 shown in FIG. 6B. The conductor layer 421 includes a first portion 421a, and a second portion 421b and a third portion 421c connected to the first portion 421a. The portions 421a, 421b, and 421c are each elongated in one direction. The portions 421a, 421b, and 421c are connected to each other at the center of the top surface of the dielectric layer 42. In FIG. 6B, the boundaries between the portions 421a, 421b, and 421c are shown by broken lines. The first portion 421a extends upward in FIG. 6B from the center of the top surface of the dielectric layer 42, and has an upper end 421a1. The second portion 421b extends leftward in FIG. 6B from the center of the top surface of the dielectric layer 42. The third portion 421c extends rightward in FIG. 6B from the center of the top surface of the dielectric layer 42. The conductor layer 421 is T-shaped as a whole.

The second portion 421b is opposed to the second portion 411b of the conductor layer 411 with the dielectric layer 41 interposed therebetween. The third portion 421c is opposed to the third portion 411c of the conductor layer 411 with the dielectric layer 41 interposed therebetween.

The dielectric layer 42 is provided with three through holes 422, 423, and 424. The through holes 422 and 423 are located near the upper end 421a1 and electrically connected to the first portion 421a. The through hole 424 is located on the lower side in FIG. 6B relative to the conductor layer 421.

A conductor layer 431 is formed on the top surface of the third dielectric layer 43 shown in FIG. 6C. The conductor layer 431 includes a first portion 431a, and a second portion 431b and a third portion 431c connected to the first portion 431a. The portions 431a, 431b, and 431c are each elongated in one direction. The portions 431a, 431b, and 431c are connected to each other at the center of the top surface of the dielectric layer 43. In FIG. 6C, the boundaries between the portions 431a, 431b, and 431c are shown by broken lines. The first portion 431a extends downward in FIG. 6C from the center of the top surface of the dielectric layer 43, and has a lower end 431a1. The second portion 431b extends leftward in FIG. 6C from the center of the top surface of the dielectric layer 43. The third portion 431c extends rightward in FIG. 6C from the center of the top surface of the dielectric layer 43. The conductor layer 431 is T-shaped as a whole.

The second portion 431b is opposed to the second portion 421b of the conductor layer 421 with the dielectric layer 42 interposed therebetween. The third portion 431c is opposed to the third portion 421c of the conductor layer 421 with the dielectric layer 42 interposed therebetween.

The dielectric layer 43 is provided with through holes 432, 433, and 434 located at positions corresponding to those of the through holes 422, 423, and 424 formed in the dielectric layer 42. The through holes 432 and 433 are located on the upper side in FIG. 6C relative to the conductor layer 431. The through hole 434 is located near the lower end 431a1 and electrically connected to the first portion 431a.

A conductor layer 441 is formed on the top surface of the fourth dielectric layer 44 shown in FIG. 6D. The conductor layer 441 constitutes the second inductor 12. The conductor layer 441 (the inductor 12) includes a first portion 441a, and a second portion 441b and a third portion 441c connected to the first portion 441a. The portions 441a, 441b, and 441c are each elongated in one direction. The portions 441a, 441b, and 441c are connected to each other at the center of the top surface of the dielectric layer 44. In FIG. 6D, the boundaries between the portions 441a, 441b, and 441c are shown by broken lines. The first portion 441a extends upward in FIG. 6D from the center of the top surface of the dielectric layer 44, and has an upper end 441a1. The second portion 441b extends leftward in FIG. 6D from the center of the top surface of the dielectric layer 44. The third portion 441c extends rightward in FIG. 6D from the center of the top surface of the dielectric layer 44. The conductor layer 441 is T-shaped as a whole. The second portion 441b is opposed to the second portion 431b of the conductor layer 431 with the dielectric layer 43 interposed therebetween. The third portion 441c is opposed to the third portion 431c of the conductor layer 431 with the dielectric layer 43 interposed therebetween.

The dielectric layer 44 is provided with through holes 442, 443, and 444 located at positions corresponding to those of the through holes 432, 433, and 434 formed in the dielectric layer 43. The through holes 442 and 443 are located near the upper end 441a1 and electrically connected to the first portion 441a. The through hole 444 is located on the lower side in FIG. 6D relative to the conductor layer 441.

A conductor layer 451 is formed on the top surface of the fifth dielectric layer 45 shown in FIG. 6E. The conductor layer 451 includes a first inductor portion 451a constituting the first inductor 11, and a third inductor portion 451b constituting the third inductor 13. The inductor portions 451a and 451b are coupled to each other at a position that is located on the upper side relative to the center in the vertical direction and also located at the center in the horizontal direction in FIG. 6E. In FIG. 6E, the boundary between the inductor portions 451a and 451b is shown by a broken line.

From the aforementioned boundary, the inductor portion 451a extends leftward, then downward, and then rightward in FIG. 6E. From the aforementioned boundary, the inductor portion 451b extends rightward, then downward, and then leftward in FIG. 6E.

Part of the second portion 441b of the conductor layer 441 is opposed to part of the first inductor portion 451a with the dielectric layer 44 interposed therebetween. Part of the third portion 441c of the conductor layer 441 is opposed to part of the third inductor portion 451b with the dielectric layer 44 interposed therebetween.

The dielectric layer 45 is provided with five through holes 452 to 456. The through holes 452 and 453 are located near the aforementioned boundary and electrically connected to the inductor portions 451a and 451b, respectively. The through hole 454 is located at a position corresponding to that of the through hole 444 formed in the dielectric layer 44. The through hole 455 is located near an end of the inductor portion 451a farther from the aforementioned boundary and is electrically connected to the inductor portion 451a. The through hole 456 is located near an end of the inductor portion 451b farther from the aforementioned boundary and is electrically connected to the inductor portion 451b.

Figure 7A:
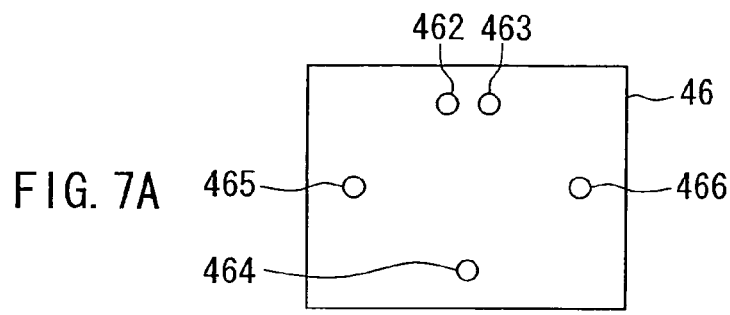
FIG. 7A to FIG. 7E are explanatory diagrams showing the top surfaces of the sixth to ninth dielectric layers and the bottom surface of the tenth dielectric layer of the layered structure of the bandpass filter according to the first embodiment of the invention.

The sixth dielectric layer 46 shown in FIG. 7A is provided with through holes 462 to 466 located at positions corresponding to those of the through holes 452 to 456 formed in the dielectric layer 45. Note that in the layered structure 30, there are provided a plurality of sixth dielectric layers 46 stacked one on another.

Figure 7B:
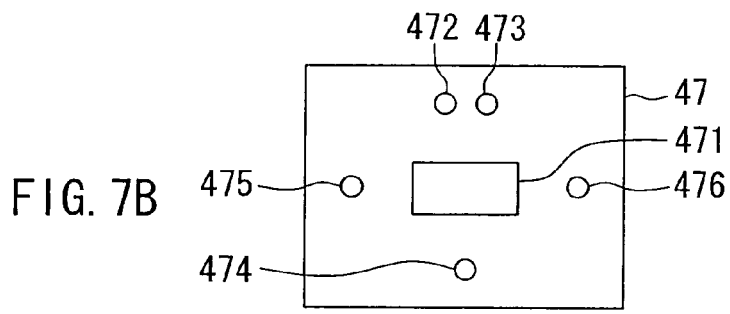

A conductor layer 471 is formed on the top surface of the seventh dielectric layer 47 shown in FIG. 7B. The dielectric layer 47 is provided with through holes 472 to 476 located at positions corresponding to those of the through holes 462 to 466 formed in the dielectric layer 46.

Figure 7C:
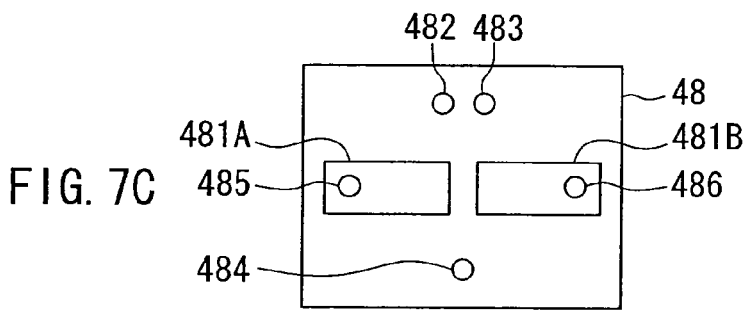

Conductor layers 481A and 481B are formed on the top surface of the eighth dielectric layer 48 shown in FIG. 7C. The conductor layer 481A is located on the left side relative to the center in the horizontal direction in FIG. 7C. The conductor layer 481B is located on the right side relative to the center in the horizontal direction in FIG. 7C. The dielectric layer 48 is provided with through holes 482 to 486 located at positions corresponding to those of the through holes 472 to 476 formed in the dielectric layer 47. The through holes 485 and 486 are electrically connected to the conductor layers 481A and 481B, respectively.

Figure 7D:
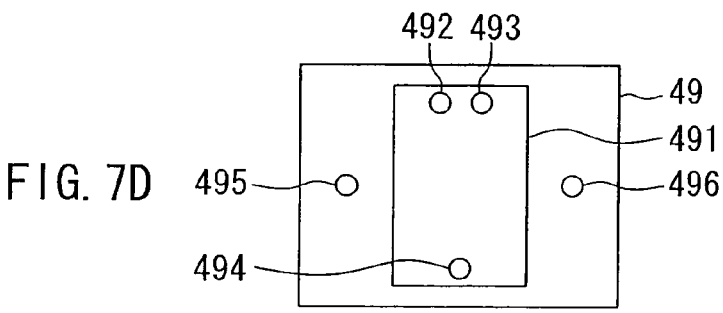

A ground conductor layer 491 is formed on the top surface of the ninth dielectric layer 49 shown in FIG. 7D. The dielectric layer 49 is provided with through holes 492 to 496 located at positions corresponding to those of the through holes 482 to 486 formed in the dielectric layer 48. The through holes 492, 493, and 494 are electrically connected to the ground conductor layer 491.

Figure 7E:
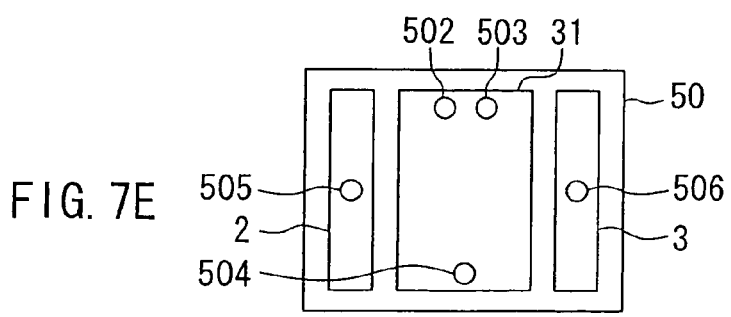

The input terminal 2, the output terminal 3, and the ground terminal 31 are formed on the bottom surface of the tenth dielectric layer 50 shown in FIG. 7E. The dielectric layer 50 is provided with through holes 502 to 506 located at positions corresponding to those of the through holes 492 to 496 formed in the dielectric layer 49. FIG. 7E shows the tenth dielectric layer 50, the terminals 2, 3 and 31, and the through holes 502 to 506 as viewed from above. The through holes 502, 503, and 504 are electrically connected to the ground terminal 31. The through hole 505 is electrically connected to the input terminal 2. The through hole 506 is electrically connected to the output terminal 3. The bottom surface of the tenth dielectric layer 50 constitutes the bottom surface 30B of the layered structure 30.

Various materials including resin, ceramic, and a composite of resin and ceramic are employable to form the dielectric layers. In particular, for better high frequency characteristics, the layered structure 30 is preferably such one that the plurality of dielectric layers are formed of ceramic by a low-temperature co-firing method. In order to reduce insertion loss in the passband, it is preferable that the dielectric layers be formed of a material having a high permittivity.

FIG. 1 shows all of the conductor layers in the layered structure 30. The conductor layers 411, 421, 431, and 441 shown in FIG. 1 are omitted in FIG. 2. The through holes 422, 432, 442, 452, 462, 472, 482, 492, and 502 are connected in series to form a through hole line 52 shown in FIG. 1 and FIG. 2. The through holes 423, 433, 443, 453, 463, 473, 483, 493, and 503 are connected in series to form a through hole line 53 shown in FIG. 1 and FIG. 2. The conductor layers 421, 441, 451, and 491 and the ground terminal 31 are electrically connected to each other via the through hole lines 52 and 53.

Portions of the through hole lines 52 and 53 extending from the conductor layer 441 to the ground terminal 31 constitute a common conductive path for electrically connecting the first to third inductors 11, 12, and 13 to the ground terminal 31. This common conductive path is formed using the through holes.

The through holes 414, 424, 434, 444, 454, 464, 474, 484, 494, and 504 are connected in series to form a through hole line 54 shown in FIG. 1 and FIG. 2. The conductor layers 411, 431, and 491 and the ground terminal 31 are electrically connected to each other via the through hole line 54.

The through holes 455, 465, 475, 485, 495, and 505 are connected in series to form a through hole line 55 shown in FIG. 1 and FIG. 2. The first inductor portion 451a of the conductor layer 451, the conductor layer 481A, and the input terminal 2 are electrically connected to each other via the through hole line 55.

The through holes 456, 466, 476, 486, 496, and 506 are connected in series to form a through hole line 56 shown in FIG. 1 and FIG. 2. The third inductor portion 451b of the conductor layer 451, the conductor layer 481B, and the output terminal 3 are electrically connected to each other via the through hole line 56.

Part of the conductor layer 481A is opposed to part of the conductor layer 491 with the dielectric layer 48 interposed therebetween. The capacitor 14 shown in FIG. 5 is formed of the conductor layers 481A and 491 and the dielectric layer 48.

Part of the conductor layer 481B is opposed to another part of the conductor layer 491 with the dielectric layer 48 interposed therebetween. The capacitor 16 shown in FIG. 5 is formed of the conductor layers 481B and 491 and the dielectric layer 48.

The conductor layer 471 is opposed to part of the conductor layer 481A and part of the conductor layer 481B with the dielectric layer 47 interposed therebetween. The capacitor 19 shown in FIG. 5 is formed of the conductor layers 471, 481A and 481B and the dielectric layer 47.

Part of the second portion 441b of the conductor layer 441 (the inductor 12) is opposed to part of the first inductor portion 451a (the inductor 11) of the conductor layer 451 with the dielectric layer 44 interposed therebetween. The capacitor 17 shown in FIG. 5 is formed of the second portion 441b, the first inductor portion 451a, and the dielectric layer 44. The second portion 441b and the first inductor portion 451a are located in close proximity to each other, thereby allowing the inductors 11 and 12 to be inductively coupled to each other.

Part of the third portion 441c of the conductor layer 441 (the inductor 12) is opposed to part of the third inductor portion 451b (the inductor 13) of the conductor layer 451 with the dielectric layer 44 interposed therebetween. The capacitor 18 shown in FIG. 5 is formed of the third portion 441c, the third inductor portion 451b, and the dielectric layer 44. The third portion 441c and the third inductor portion 451b are located in close proximity to each other, thereby allowing the inductors 12 and 13 to be inductively coupled to each other.

The capacitor 15 shown in FIG. 5 is formed using three or more conductor layers that are disposed at different positions in the stacking direction T. In the present embodiment, in particular, the capacitor 15 is formed using four conductor layers 411, 421, 431, and 441 disposed at different positions in the stacking direction T. More specifically, the capacitor 15 is formed of the second and third portions 411b and 411c of the conductor layer 411, the second and third portions 421b and 421c of the conductor layer 421, the second and third portions 431b and 431c of the conductor layer 431, the second and third portions 441b and 441c of the conductor layer 441, and the dielectric layers 41, 42, and 43.

The fourth inductor 20 is formed of the first portion 411a of the conductor layer 411 and the first portion 431a of the conductor layer 431.

As has been described, the bandpass filter 1 according to the present embodiment includes: the layered structure 30 including a plurality of dielectric layers that are stacked; the input terminal 2, the output terminal 3 and the ground terminal 31 disposed on the bottom surface 30B of the periphery of the layered structure 30; and the first resonator 4, the second resonator 5, and the third resonator 6 provided within the layered structure 30. Of the first to third resonators 4, 5, and 6, the first resonator 4 is located closest to the input terminal 2, the third resonator 6 is located closest to the output terminal 3, and the second resonator 5 is located between the first resonator 4 and the third resonator 6, in terms of circuit configuration. The first resonator 4 includes the first inductor 11 and the first capacitor 14. The second resonator 5 includes the second inductor 12, the second capacitor 15, and the fourth inductor 20. The third resonator 6 includes the third inductor 13 and the third capacitor 16.

The second inductor 12 is disposed at a position different from that of each of the first and third inductors 11 and 13 in the stacking direction T of the plurality of dielectric layers. In the present embodiment, in particular, the first and third inductors 11 and 13 are located on the same dielectric layer 45. No conductor layer is present between the second inductor 12 (the conductor layer 441) and the first inductor 11 (the first inductor portion 451a of the conductor layer 451) and between the second inductor 12 (the conductor layer 441) and the third inductor 13 (the third inductor portion 451b of the conductor layer 451).

The first to third capacitors 14, 15, and 16 are disposed at positions different from those of the first to third inductors 11, 12, and 13 in the stacking direction T. More specifically, the capacitors 14 and 16 are located closer to the bottom surface 30B than are the inductors 11, 12, and 13. The capacitor 15 is located closer to the top surface 30A than are the inductors 11, 12, and 13.

The second inductor 12 is lower in inductance than the first inductor 11 and the third inductor 13. The second capacitor 15 is higher in capacitance than the first capacitor 14 and the third capacitor 16.

In the bandpass filter 1 according to the present embodiment, the second inductor 12 can be shaped into a smaller size since the second inductor 12 is lower in inductance than the first and third inductors 11 and 13. This allows a reduction in size of the bandpass filter 1. Note that if the first and third inductors 11 and 13 are shaped into a smaller size, their inductances will be reduced to thereby cause the input/output impedance of the bandpass filter 1 to be lower than a desired value. It is thus not preferable to shape the first and third inductors 11 and 13 into a smaller size. In contrast to this, reducing the inductance of the second inductor 12 allows a reduction in size of the bandpass filter 1 without causing the input/output impedance of the bandpass filter 1 to be lower than the desired value.

The conductor layer 441 constituting the second inductor 12 has the first portion 441a, and the second and third portions 441b and 441c connected to the first portion 441a, so that the entire conductor layer 441 is T-shaped. This allows the inductor 12 to be increased in inductance to some extent while allowing the conductor layer 441 (the inductor 12) to be small in size, and also allows the second and third portions 441b and 441c to be located close to the inductors 11 and 13, respectively.

It should be noted that simply making the second inductor 12 lower in inductance than the first and third inductors 11 and 13 may not necessarily allow the second resonator 5 to provide a desired resonant frequency. To address this problem, the present embodiment is configured not only so that the second inductor 12 is lower in inductance than the first and third inductors 11 and 13 but also that the second capacitor 15 is higher in capacitance than the first and third capacitors 14 and 16. This makes it possible to allow the second resonator 5 to provide a desired resonant frequency.

In the present embodiment, the second capacitor 15 is formed using three or more conductor layers that are disposed at different positions in the stacking direction T. It is thus possible to increase the capacitance of the capacitor 15 more easily than in the case where the capacitor 15 is formed using two conductor layers.

Furthermore, in the present embodiment, since the second resonator 5 includes the fourth inductor 20 connected in series to the second capacitor 15, it is possible to reduce the capacitance of the second capacitor 15 needed to achieve the desired resonant frequency of the resonator 5 to a smaller value when compared with the case of the absence of the fourth inductor 20. This eliminates the need for making the capacitance of the second capacitor 15 extremely higher than those of the first and third capacitors 14 and 16. As a result, it becomes easy to form the second capacitor 15.

Furthermore, according to the present embodiment, since second inductor 12 is lower in inductance than the first and third inductors 11 and 13, it is possible to prevent the inductive coupling between the second inductor 12 and the first inductor 11 and the inductive coupling between the second inductor 12 and the third inductor 13 from being excessively enhanced even when the second inductor 12 and the first inductor 11 are located close to each other and the second inductor 12 and the third inductor 13 are located close to each other. This makes it possible to reduce the bandpass filter 1 in size.

Furthermore, in the present embodiment, no conductor layer is present between the second inductor 12 and the first inductor 11 and between the second inductor 12 and the third inductor 13. Thus, the magnetic field produced from the inductors 11, 12 and 13 and contributing to the inductive coupling between the adjacent resonators will not be hindered by any conductor layer. It is thus possible to prevent the first to third resonators 4, 5, and 6 from being degraded in Q.

As can be seen from the foregoing, the bandpass filter 1 according to the present embodiment achieves a reduction in size while preventing the resonators 4, 5, and 6 from being degraded in Q.

On the other hand, in general, layered bandpass filters need to be configured so that a ground-side end of the inductor in each resonator is electrically connected to the ground terminal provided on the periphery of the layered structure. Two methods are essentially available for electrically connecting the ground-side end of the inductor to the ground terminal. A first method is to provide the ground terminal on a side surface of the layered structure and provide a conductor portion inside the layered structure for connecting the ground-side end of the inductor to the ground terminal. A second method is to provide the ground terminal on the bottom surface of the layered structure and provide through holes inside the layered structure for connecting the ground-side end of the inductor to the ground terminal. To reduce the footprint of the layered bandpass filter, the second method is more advantageous. For a layered bandpass filter that includes three or more resonators, however, employing the second method would increase the number of steps for manufacturing the layered bandpass filter because of a larger number of through holes, and would also cause quality degradation such as cracking of the layered structure.

In contrast to this, the bandpass filter 1 according to the present embodiment is provided with the common conductive path (portions of the through hole lines 52 and 53) for electrically connecting the first to third inductors 11, 12, and 13 to the ground terminal 31. This common conductive path includes through holes. The present embodiment allows a reduction in the number of through holes when compared with the case of providing three through hole lines for connecting the ground-side ends of three inductors to the ground terminal. Consequently, according to the present embodiment, it is possible to prevent an increase in the number of steps for manufacturing the bandpass filter 1 and prevent the bandpass filter 1 from suffering quality degradation such as cracking of the layered structure 30.

Figure 8:
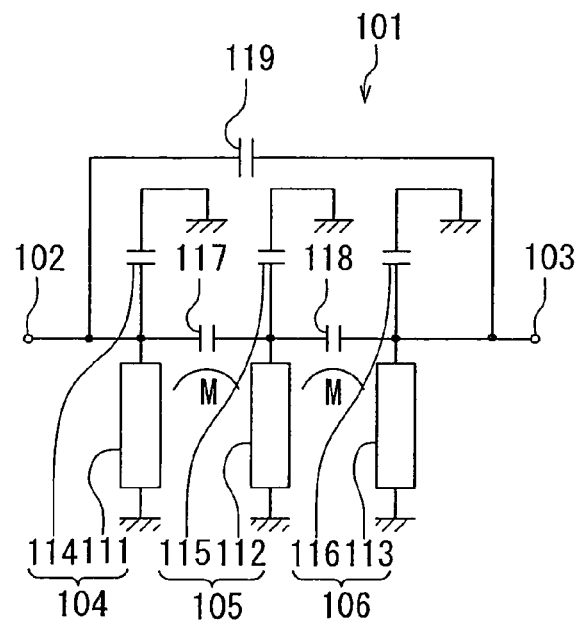
FIG. 8 is a circuit diagram showing the circuit configuration of a bandpass filter of a comparative example.

Now, a comparison will be made between a bandpass filter 101 of a comparative example and the bandpass filter 1 according to the present embodiment in order to further explain the effects of the bandpass filter 1. First, the circuit configuration of the bandpass filter 101 of the comparative example will be described with reference to FIG. 8. As shown in FIG. 8, the bandpass filter 101 has an input terminal 102, an output terminal 103, resonators 104, 105 and 106, and capacitors 117, 118 and 119 in place of the input terminal 2, the output terminal 3, the resonators 4, 5 and 6, and the capacitors 17, 18 and 19 of the bandpass filter 1 according to the present embodiment. The resonator 104 includes an inductor 111 and a capacitor 114. The resonator 105 includes an inductor 112 and a capacitor 115. The resonator 106 includes an inductor 113 and a capacitor 116. The inductors 111, 112 and 113 and the capacitors 114, 115 and 116 correspond to the inductors 11, 12 and 13 and the capacitors 14, 15 and 16 of the present embodiment, respectively, The resonator 105 does not include any inductor corresponding to the inductor 20 of the present embodiment.

Figure 9:
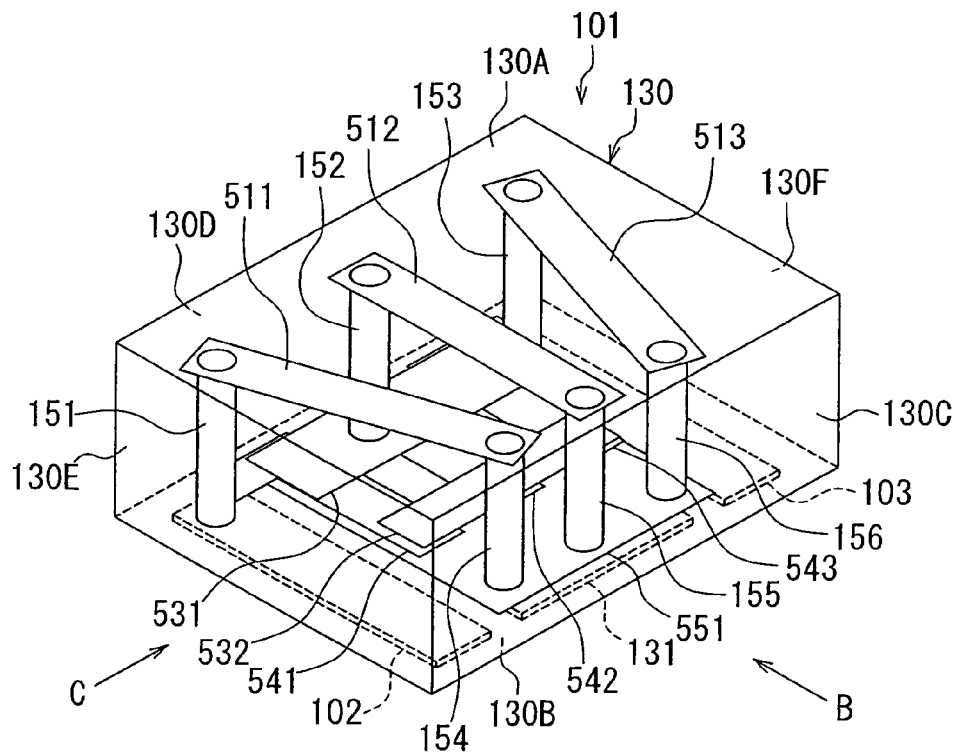
FIG. 9 is a perspective view showing the main part of the bandpass filter of the comparative example.
Figure 10:
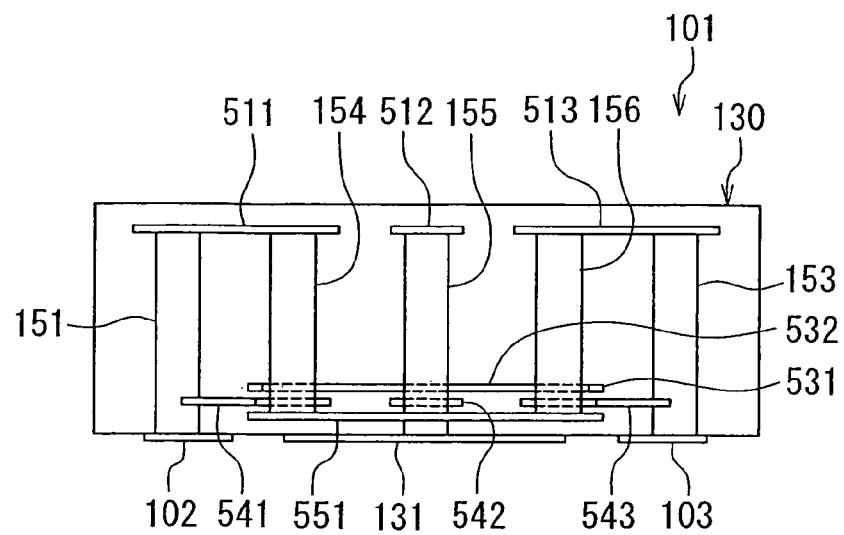
FIG. 10 is an explanatory diagram showing the main part of the bandpass filter of the comparative example as viewed from direction B of FIG. 9.
Figure 11:
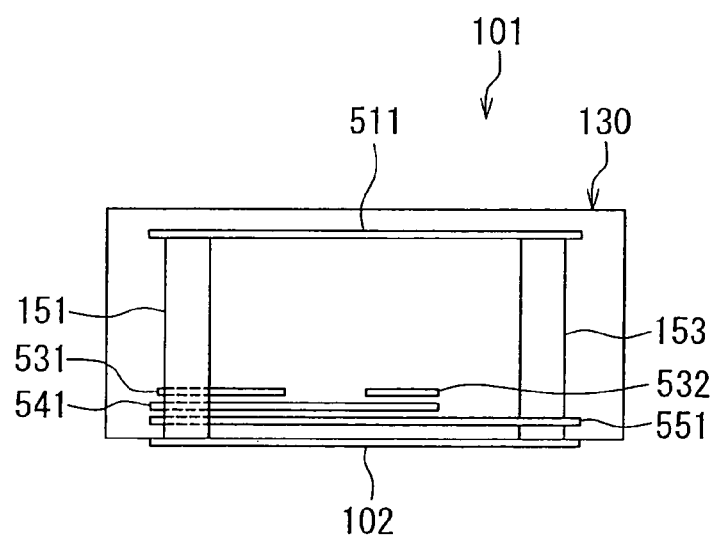
FIG. 11 is an explanatory diagram showing the main part of the bandpass filter of the comparative example as viewed from direction C of FIG. 9.

The outline of the structure of the bandpass filter 101 will be described with reference to FIG. 9 to FIG. 11. FIG. 9 is a perspective view showing the main part of the bandpass filter 101. FIG. 10 is an explanatory diagram showing the main part of the bandpass filter 101 as viewed in direction B of FIG. 9. FIG. 11 is an explanatory diagram showing the main part of the bandpass filter 101 as viewed in direction C of FIG. 9.

The bandpass filter 101 includes a layered structure 130. The layered structure 130 includes a plurality of dielectric layers and a plurality of conductor layers that are stacked. The layered structure 130 is in the shape of a rectangular solid and has a periphery. The periphery of the layered structure 130 includes a top surface 130A, a bottom surface 130B, and four side surfaces 130C to 130F. The bandpass filter 101 further includes a ground terminal 131 disposed on the bottom surface 130B of the layered structure 130. The input terminal 102 and the output terminal 103 are disposed on the bottom surface 130B such that the ground terminal 131 is interposed between the input terminal 102 and the output terminal 103.

Figure 12A:
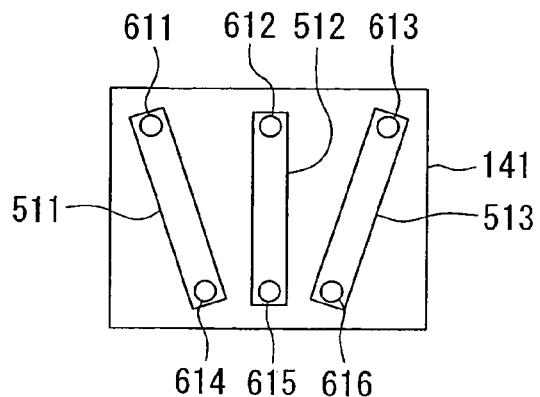
FIG. 12A to FIG. 12C are explanatory diagrams showing the top surfaces of the first to third dielectric layers of the layered structure of the bandpass filter of the comparative example.
Figure 12B:
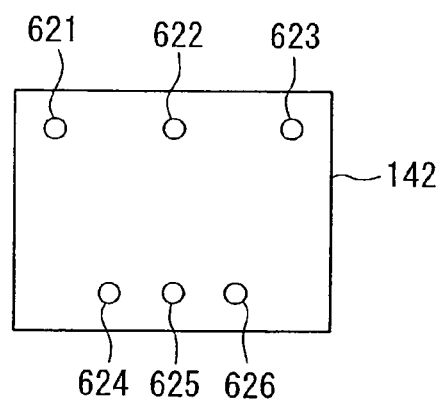
Figure 12C:
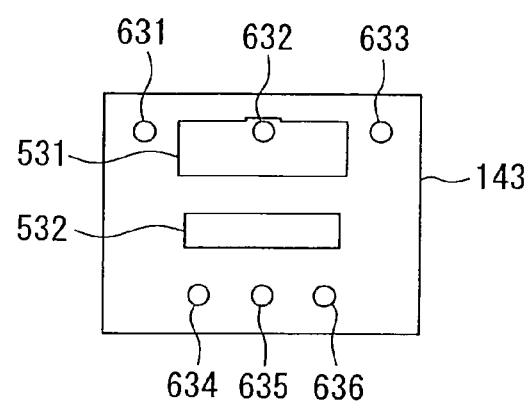
Figure 13A:
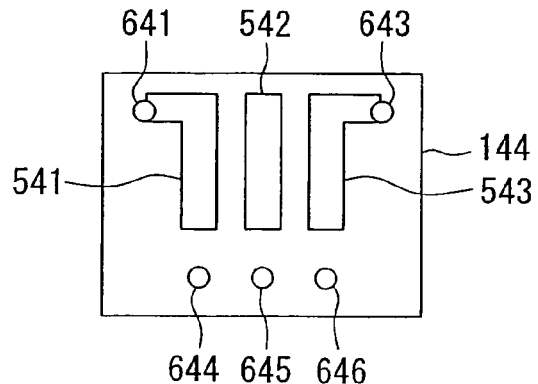
FIG. 13A to FIG. 13C are explanatory diagrams showing the top surfaces of the fourth and fifth dielectric layers and the bottom surface of the sixth dielectric layer of the layered structure of the bandpass filter of the comparative example.
Figure 13B:
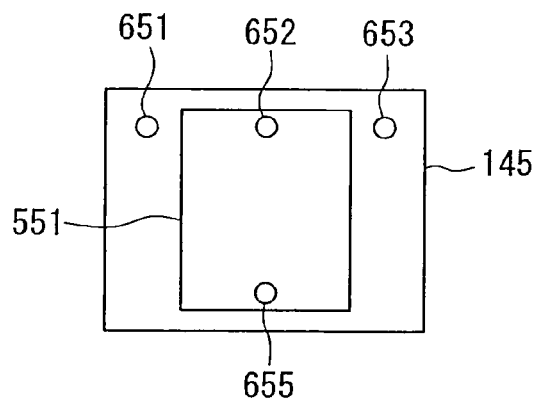
Figure 13C:
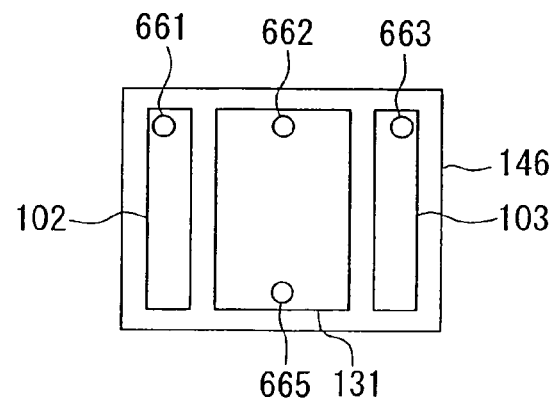

The layered structure 130 will now be described with reference to FIG. 12A to FIG. 12C and FIG. 13A to FIG. 13C. FIG. 12A to FIG. 12C show the top surfaces of first to third dielectric layers of the layered structure 130, respectively. FIG. 13A to FIG. 13C show the top surfaces of fourth and fifth dielectric layers and the bottom surface of a sixth dielectric layer of the layered structure 130, respectively. In the layered structure 130, the first to sixth dielectric layers are arranged in this order from the top.

On the top surface of the first dielectric layer 141 shown in FIG. 12A, there are formed three conductor layers 511, 512, and 513 that are each elongated in one direction. In the layered structure 130, although not illustrated, a dielectric layer without any conductor layer formed thereon is disposed on the dielectric layer 141. The dielectric layer 141 is provided with six through holes 611 to 616. The through holes 611, 612, and 613 are located near respective one ends of the conductor layers 511, 512, and 513 and electrically connected to the conductor layers 511, 512, and 513, respectively. The through holes 614, 615, and 616 are located near respective other ends of the conductor layers 511, 512, and 513 and electrically connected to the conductor layers 511, 512, and 513, respectively.

The second dielectric layer 142 shown in FIG. 12B is provided with through holes 621 to 626 located at positions corresponding to those of the through holes 611 to 616 formed in the dielectric layer 141. Note that in the layered structure 130, there are provided a plurality of second dielectric layers 142 stacked one on another.

Two conductor layers 531 and 532 are formed on the top surface of the third dielectric layer 143 shown in FIG. 12C. The dielectric layer 143 is provided with through holes 631 to 636 located at positions corresponding to those of the through holes 621 to 626 formed in the dielectric layer 142. The through hole 632 is electrically connected to the conductor layer 531.

Three conductor layers 541, 542, and 543 are formed on the top surface of the fourth dielectric layer 144 shown in FIG. 13A. The through hole 632 is electrically connected to the conductor layer 542. The dielectric layer 144 is provided with through holes 641 and 643 to 646 located at positions corresponding to those of the through holes 631 and 633 to 636 formed in the dielectric layer 143. The through holes 641 and 643 are electrically connected to the conductor layers 541 and 543, respectively.

A ground conductor layer 551 is formed on the top surface of the fifth dielectric layer 145 shown in FIG. 13B. The conductor layers 541, 542, and 543 are opposed to the ground conductor layer 551 with the dielectric layer 144 interposed therebetween. The through holes 644, 645, and 646 are electrically connected to the ground conductor layer 551. The dielectric layer 145 is provided with through holes 651, 653, and 655 located at positions corresponding to those of the through holes 641, 643, and 645 formed in the dielectric layer 144, and a through hole 652. The through holes 652 and 655 are electrically connected to the ground conductor layer 551.

The input terminal 102, the output terminal 103, and the ground terminal 131 are formed on the bottom surface of the sixth dielectric layer 146 shown in FIG. 13C. The dielectric layer 146 is provided with through holes 661, 662, 663, and 665 located at positions corresponding to those of the through holes 651, 652, 653, and 655 formed in the dielectric layer 145. FIG. 13C shows the dielectric layer 146, the terminals 102, 103 and 131, and the through holes 661, 662, 663, and 665 as viewed from above. The through holes 662 and 665 are electrically connected to the ground terminal 131. The through hole 661 is electrically connected to the input terminal 102. The through hole 663 is electrically connected to the output terminal 103. The bottom surface of the sixth dielectric layer 146 constitutes the bottom surface 130B of the layered structure 130.

The through holes 611, 621, 631, 641, 651, and 661 are connected in series to form a through hole line 151 shown in FIG. 9. The conductor layers 511 and 541 and the input terminal 102 are electrically connected to each other via the through hole line 151.

The through holes 612, 622, and 632 are connected in series to form a through hole line 152 shown in FIG. 9. The conductor layers 512, 531, and 542 are electrically connected to each other via the through hole line 152.

The through holes 613, 623, 633, 643, 653, and 663 are connected in series to form a through hole line 153 shown in FIG. 9. The conductor layers 513 and 543 and the output terminal 103 are electrically connected to each other via the through hole line 153.

The through holes 614, 624, 634, and 644 are connected in series to form a through hole line 154 shown in FIG. 9. The conductor layers 511 and 551 are electrically connected to each other via the through hole line 154.

The through holes 615, 625, 635, 645, 655, and 665 are connected in series to form a through hole line 155 shown in FIG. 9. The conductor layers 512 and 551 and the ground terminal 131 are electrically connected to each other via the through hole line 155.

The through holes 616, 626, 636, and 646 are connected in series to form a through hole line 156 shown in FIG. 9. The conductor layers 513 and 551 are electrically connected to each other via the through hole line 156.

The inductor 111 shown in FIG. 8 is formed of the through hole line 151, the conductor layer 511, and the through hole line 154. The inductor 112 shown in FIG. 8 is formed of the through hole line 152, the conductor layer 512, and the through hole line 155. The inductor 113 shown in FIG. 8 is formed of the through hole line 153, the conductor layer 513, and the through hole line 156.

The capacitor 114 shown in FIG. 8 is formed of the conductor layers 541 and 551 and the dielectric layer 144. The capacitor 115 shown in FIG. 8 is formed of the conductor layers 542 and 551 and the dielectric layer 144. The capacitor 116 shown in FIG. 8 is formed of the conductor layers 543 and 551 and the dielectric layer 144. The capacitor 117 shown in FIG. 8 is formed of the conductor layers 531 and 541 and the dielectric layer 143. The capacitor 118 shown in FIG. 8 is formed of the conductor layers 531 and 543 and the dielectric layer 143. The capacitor 119 shown in FIG. 8 is formed of the conductor layers 532, 541 and 543 and the dielectric layer 143.

Now, with reference to FIG. 14A, FIG. 14B, and FIG. 15, a description will be given of the difference between the bandpass filter 101 of the comparative example and the bandpass filter 1 according to the present embodiment in terms of the mode of the inductive coupling between adjacent resonators.

Figure 14A:
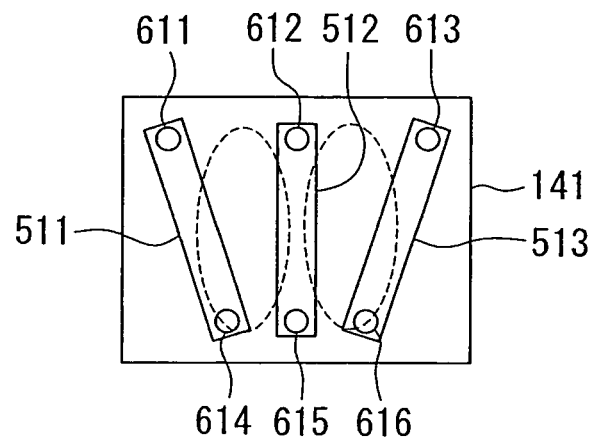
FIG. 14A and FIG. 14B are explanatory diagrams illustrating the inductive coupling between adjacent resonators in the bandpass filter of the comparative example.
Figure 14B:
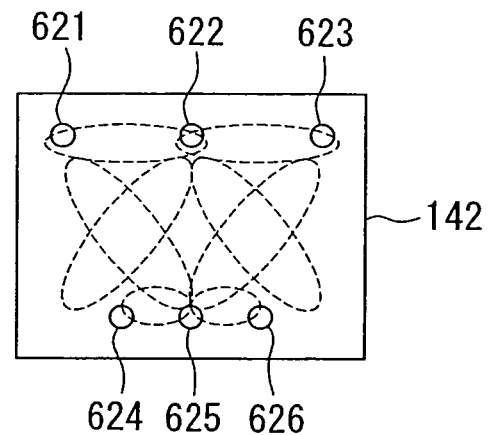

FIG. 14A and FIG. 14B are explanatory diagrams illustrating the inductive coupling between adjacent resonators in the bandpass filter 101 of the comparative example. FIG. 14A and FIG. 14B show the top surfaces of the dielectric layers 141 and 142, respectively. In FIG. 14A and FIG. 14B, the ellipses drawn in broken lines represent the regions in which an enhanced inductive coupling is established between adjacent resonators. In the bandpass filter 101, inductive coupling is established not only between the conductor layers 511 and 512 and between the conductor layers 512 and 513 but also between any two of the through hole lines 151, 152, 153, 154, 155, and 156 that are included in two adjacent resonators. As shown in FIG. 9, the conductor layers 531, 532, 541, 542, and 543 are present in the space defined by the through hole lines 151, 152, 153, 154, 155, and 156. Consequently, in the bandpass filter 101, the magnetic field contributing to inductive coupling between two adjacent resonators is hindered by the conductor layers 531, 532, 541, 542, and 543, so that the resonators suffer degradation in Q.

Figure 15:
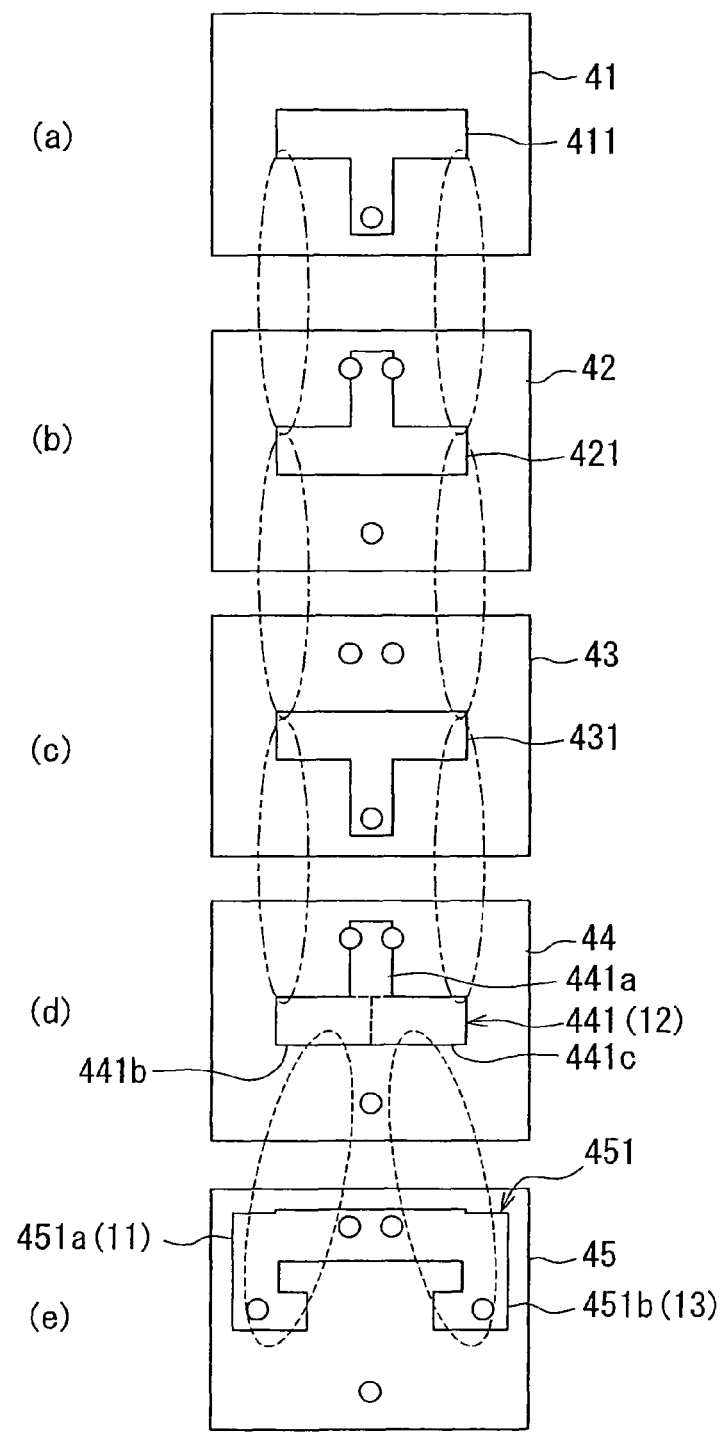
FIG. 15 is an explanatory diagram illustrating the inductive coupling between adjacent resonators and electric field producing regions of the second capacitor in the bandpass filter according to the first embodiment of the invention.

FIG. 15 is an explanatory diagram illustrating the inductive coupling between adjacent resonators and the electric field producing regions of the second capacitor 15 in the bandpass filter 1 according to the present embodiment. Portions (a) to (e) of FIG. 15 show the top surfaces of the dielectric layers 41 to 45, respectively. In FIG. 15, the ellipses drawn in broken lines represent the regions in which an enhanced inductive coupling is established between adjacent resonators. Furthermore, in FIG. 15, the ellipses drawn in chain double-dashed lines represent the electric field producing regions of the capacitor 15. In the bandpass filter 1, as shown in portions (d) and (e) of FIG. 15, the inductive coupling between the inductors 11 and 12 occurs between the conductor layer 441 and the first inductor portion 451a of the conductor layer 451, and the inductive coupling between the inductors 12 and 13 occurs between the conductor layer 441 and the third inductor portion 451b of the conductor layer 451. In particular, a tight inductive coupling between the inductors 11 and 12 occurs between the second portion 441b of the conductor layer 441 and the first inductor portion 451a of the conductor layer 451, and a tight inductive coupling between the inductors 12 and 13 occurs between the third portion 441c of the conductor layer 441 and the third inductor portion 451b of the conductor layer 451. No conductor layer is present between the conductor layer 441 (the inductor 12) and the first inductor portion 451a (the inductor 11) and between the conductor layer 441 (the inductor 12) and the third inductor portion 451b (the inductor 13). Thus, in the bandpass filter 1, the magnetic field contributing to the inductive coupling between adjacent resonators will not be hindered by any conductor layer. This makes it possible to prevent the first to third resonators 4, 5, and 6 from being degraded in Q.

Figure 16:
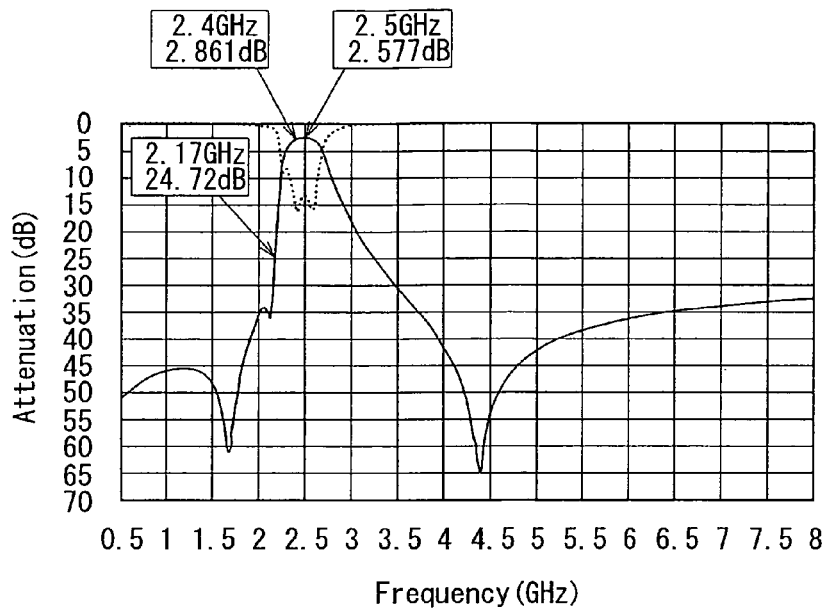
FIG. 16 is a characteristic chart showing an example of characteristics of the bandpass filter of the comparative example.
Figure 17:
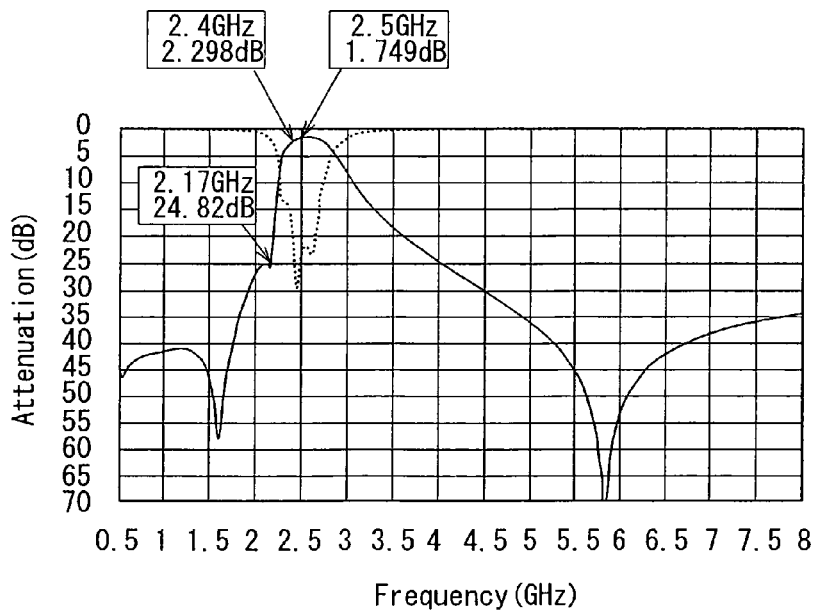
FIG. 17 is a characteristic chart showing an example of characteristics of the bandpass filter according to the first embodiment of the invention.

Reference is now made to FIG. 16 and FIG. 17 to describe the results of a simulation which was conducted to determine the characteristics of the bandpass filter 101 of the comparative example and the bandpass filter 1 according to the present embodiment. In the simulation, the bandpass filter 101 and the bandpass filter 1 were designed to have a passband of approximately 2.4 to 2.5 GHz to determine their respective insertion loss characteristics and return loss characteristics. The frequency band of 2.4 to 2.5 GHz corresponds to one of frequency bands used in wireless LANs. FIG. 16 shows an example of the characteristics of the bandpass filter 101 of the comparative example determined by the simulation. FIG. 17 shows an example of the characteristics of the bandpass filter 1 according to the present embodiment determined by the simulation. In FIG. 16 and FIG. 17, the horizontal axis represents frequency while the vertical axis represents attenuation. In FIG. 16 and FIG. 17, the solid curve indicates the insertion loss characteristic while the dotted curve indicates the return loss characteristic.

According to the insertion loss characteristic of the bandpass filter 101 of the comparative example shown in FIG. 16, the attenuations at 2.17 GHz, 2.4 GHz, and 2.5 GHz are 24.72 dB, 2.861 dB, and 2.577 dB, respectively. According to the insertion loss characteristic of the bandpass filter 1 according to the present embodiment shown in FIG. 17, the attenuations at 2.17 GHz, 2.4 GHz, and 2.5 GHz are 24.82 dB, 2.298 dB, and 1.749 dB, respectively. As such, when compared with the bandpass filter 101 of the comparative example, the bandpass filter 1 according to the present embodiment is capable of providing reduced attenuations in the 2.4- to 2.5-GHz passband in the insertion loss characteristic. This is possible because, as described above, the present embodiment is capable of preventing degradation in Q of the resonators 4, 5, and 6.

[Second Embodiment]

A bandpass filter according to a second embodiment of the invention will now be described. The bandpass filter 201 according to the present embodiment has the same circuit configuration as that of the first embodiment, which is as shown in FIG. 5.

Figure 18:
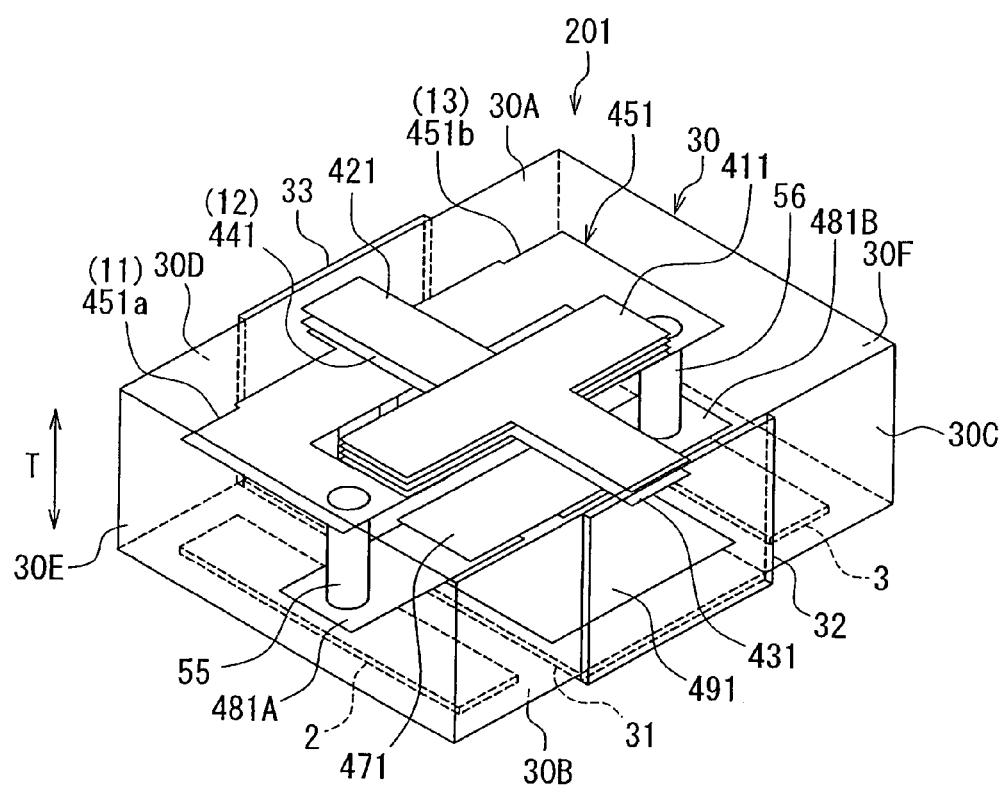
FIG. 18 is a perspective view showing the main part of a bandpass filter according to a second embodiment of the invention.
Figure 19:
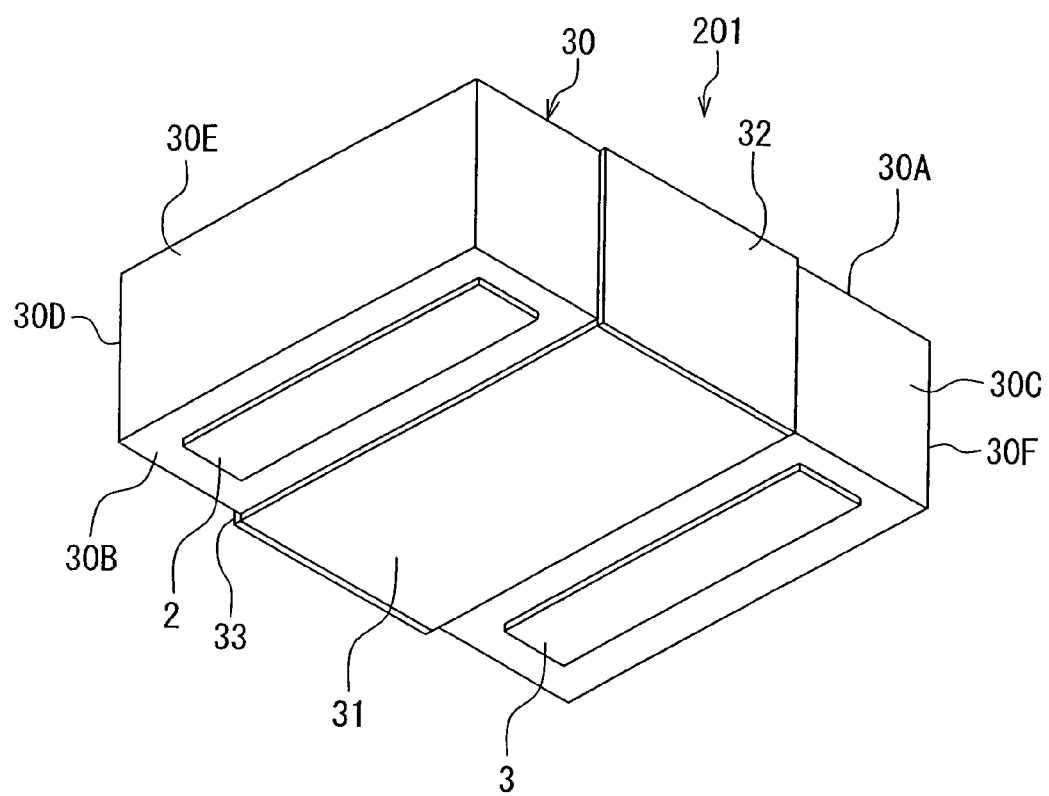
FIG. 19 is a perspective view of the bandpass filter according to the second embodiment of the invention as viewed from below.

FIG. 18 is a perspective view showing the main part of the bandpass filter 201. FIG. 19 is a perspective view of the bandpass filter 201 as viewed from below. The bandpass filter 201 includes a layered structure 30. As in the first embodiment, the layered structure 30 is in the shape of a rectangular solid and has a periphery. The periphery of the layered structure 30 includes a top surface 30A, a bottom surface 30B, and four side surfaces 30C to 30F. In the present embodiment, as shown in FIG. 19, the ground terminal 31 is formed to extend from the ridge between the bottom surface 30B and the side surface 30C to the ridge between the bottom surface 30B and the side face 30D. The bandpass filter 201 includes conductor layers 32 and 33 disposed on the side surfaces 30C and 30D of the periphery of the layered structure 30. The conductor layer 32 is formed to extend from the ridge between the top surface 30A and the side surface 30C to the vicinity of the ridge between the bottom surface 30B and the side surface 30C. The conductor layer 33 is formed to extend from the ridge between the top surface 30A and the side surface 30D to the vicinity of the ridge between the bottom surface 30B and the side surface 30D. The conductor layers 32 and 33 are electrically connected to the ground terminal 31.

Differences of the layered structure 30 of the present embodiment from the layered structure 30 of the first embodiment will now be described with reference to FIG. 20A to FIG. 20E and FIG. 21A to FIG. 21E. FIG. 20A to FIG. 20E show the top surfaces of the first to fifth dielectric layers of the layered structure 30, respectively. FIG. 21A to FIG. 21E show the top surfaces of the sixth to ninth dielectric layers and the bottom surface of the tenth dielectric layer of the layered structure 30, respectively.

Figure 20A:
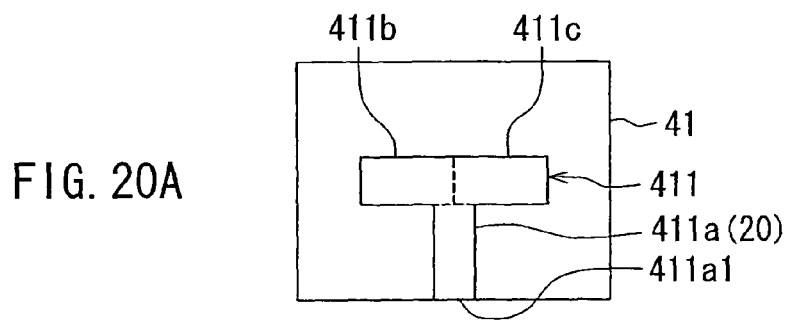
FIG. 20A to FIG. 20E are explanatory diagrams showing the top surfaces of the first to fifth dielectric layers of the layered structure of the bandpass filter according to the second embodiment of the invention.

As shown in FIG. 20A, the first portion 411a of the conductor layer 411 formed on the top surface of the first dielectric layer 41 extends from the center of the top surface of the dielectric layer 41 to the lower end in FIG. 20A. Furthermore, the dielectric layer 41 is without the through hole 414.

Figure 20B:
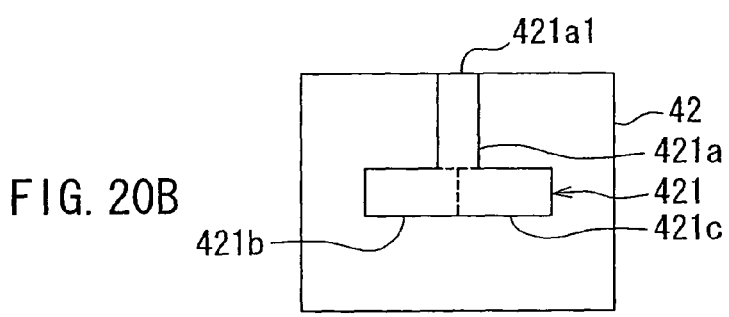

As shown in FIG. 20B, the first portion 421a of the conductor layer 421 formed on the top surface of the second dielectric layer 42 extends from the center of the top surface of the dielectric layer 42 to the upper end in FIG. 20B. Furthermore, the dielectric layer 42 is without the through holes 422, 423, and 424.

Figure 20C:
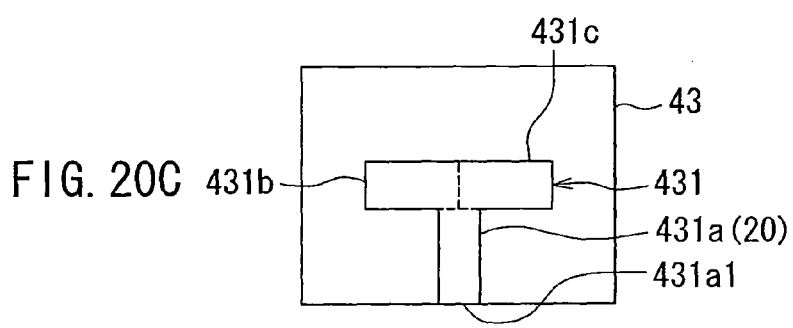

As shown in FIG. 20C, the first portion 431a of the conductor layer 431 formed on the top surface of the third dielectric layer 43 extends from the center of the top surface of the dielectric layer 43 to the lower end in FIG. 20C. Furthermore, the dielectric layer 43 is without the through holes 432, 433, and 434.

Figure 20D:
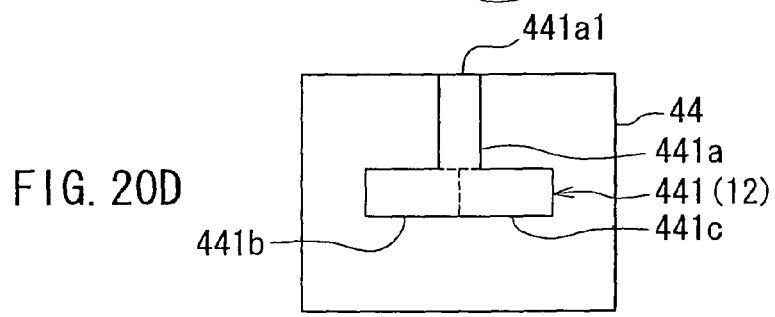

As shown in FIG. 20D, the first portion 441a of the conductor layer 441 formed on the top surface of the fourth dielectric layer 44 extends from the center of the top surface of the dielectric layer 44 to the upper end in FIG. 20D. Furthermore, the dielectric layer 44 is without the through holes 442, 443, and 444.

Figure 20E:
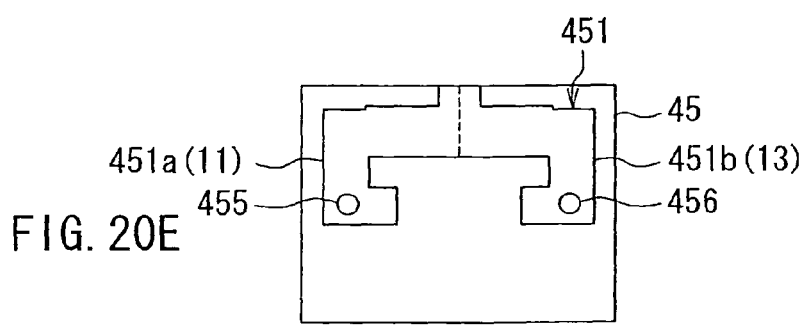

As shown in FIG. 20E, parts of the inductor portions 451a and 451b of the conductor layer 451 formed on the top surface of the fifth dielectric layer 45 extend to the upper end in FIG. 20E on the top surface of the dielectric layer 45. Furthermore, the dielectric layer 45 is without the through holes 452, 453, and 454.

Figure 21A:
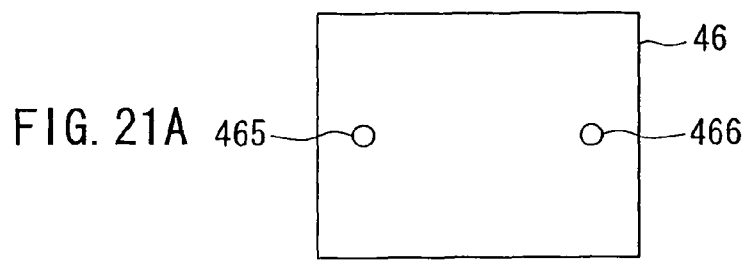
FIG. 21A to FIG. 21E are explanatory diagrams showing the top surfaces of the sixth to ninth dielectric layers and the bottom surface of the tenth dielectric layer of the layered structure of the bandpass filter according to the second embodiment of the invention.
Figure 21B:
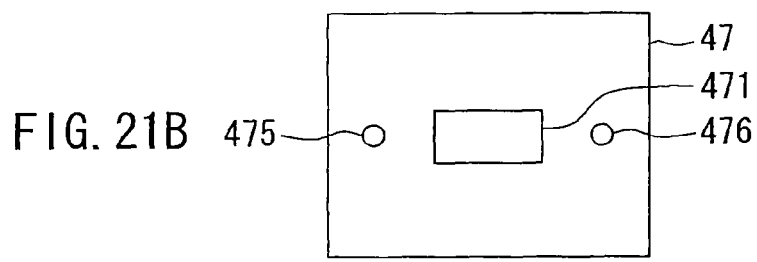
Figure 21C:
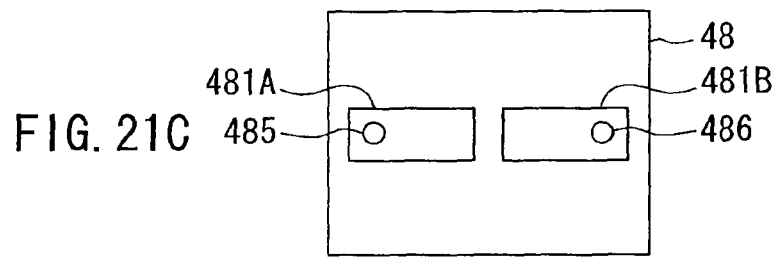

As shown in FIG. 21A, the sixth dielectric layer 46 is without the through holes 462, 463, and 464. As shown in FIG. 21B, the seventh dielectric layer 47 is without the through holes 472, 473, and 474. As shown in FIG. 21C, the eighth dielectric layer 48 is without the through holes 482, 483, and 484.

Figure 21D:
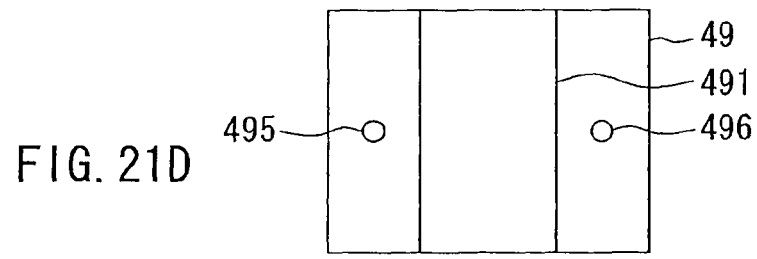

As shown in FIG. 21D, the ground conductor layer 491 formed on the top surface of the ninth dielectric layer 49 extends from the upper end to the lower end in FIG. 21D on the top surface of the dielectric layer 49. Furthermore, the dielectric layer 49 is without the through holes 492, 493, and 494.

Figure 21E:
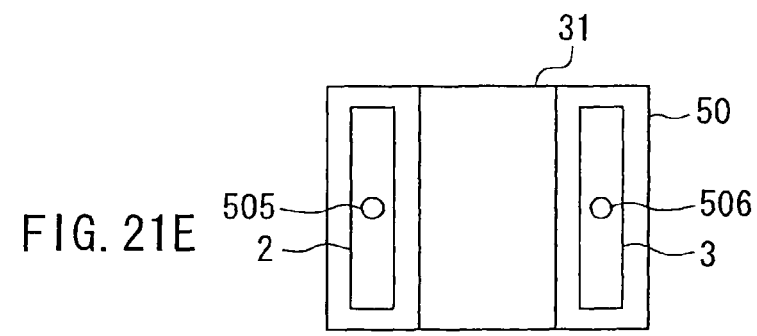

As shown in FIG. 21E, the ground terminal 31 formed on the bottom surface of the tenth dielectric layer 50 extends from the upper end to the lower end in FIG. 21E on the bottom surface of the dielectric layer 50. Furthermore, the dielectric layer 50 is without the through holes 502, 503, and 504.

The first portion 411a of the conductor layer 411, the first portion 431a of the conductor layer 431, the conductor layer 491, and the ground terminal 31 are electrically connected to the conductor layer 32. The first portion 421a of the conductor layer 421, the first portion 441a of the conductor layer 441, the inductor portions 451a and 451b of the conductor layer 451, the conductor layer 491, and the ground terminal 31 are electrically connected to the conductor layer 33. The conductor layers 32 and 33 are formed on the side surfaces 30C and 30D of the layered structure 30 after the layered structure 30 is fabricated.

In the present embodiment, there are not provided the through hole lines 52, 53, and 54 of the first embodiment. The conductor layer 32 forms a conductive path to substitute for the through hole line 54. The conductor layer 33 forms a conductive path to substitute for the through hole lines 52 and 53. The portion of the conductor layer 33 extending from the conductor layer 451 to the ground terminal 31 forms a common conductive path for electrically connecting the first to third inductors 11, 12, and 13 to the ground terminal 31. In the present embodiment, the common conductive path is thus formed using the conductor layer 33 disposed on the periphery of the layered structure 30.

In the present embodiment, the number of through holes is smaller than in the first embodiment. This makes it possible to further prevent the quality degradation of the bandpass filter 201 caused by through holes. The remainder of configuration, function and effects of the present embodiment are similar to those of the first embodiment.

The present invention is not limited to the foregoing embodiments, and various modifications may be made thereto. For example, the first inductor and the third inductor may be disposed on different dielectric layers. Furthermore, the bandpass filter of the present invention may include four or more resonators. In this case, there are provided a plurality of second resonators.

It is apparent that the present invention can be carried out in various forms and modifications in the light of the foregoing descriptions. Accordingly, within the scope of the following claims and equivalents thereof, the present invention can be carried out in forms other than the foregoing most preferable embodiments.

What is claimed is:

1. A layered bandpass filter comprising:
    a layered structure including a plurality of dielectric layers that are stacked;
    an input terminal and an output terminal disposed on a periphery of the layered structure; and
    a first resonator, a second resonator, and a third resonator provided within the layered structure, wherein:
    of the first to third resonators, the first resonator is located closest to the input terminal, the third resonator is located closest to the output terminal, and the second resonator is located between the first resonator and the third resonator, in terms of circuit configuration;
    the first resonator includes a first inductor and a first capacitor;
    the second resonator includes a second inductor and a second capacitor;
    the third resonator includes a third inductor and a third capacitor;
    the second inductor is disposed at a position different from that of each of the first and third inductors in a stacking direction of the plurality of dielectric layers;

no conductor layer is present between the second inductor and the first inductor and between the second inductor and the third inductor;

the second inductor includes a first portion, a second portion, and a third portion;

the first portion is elongated in one direction;

the second portion and the third portion are connected to a same longitudinal end of the first portion;

part of the second portion is opposed to part of the first inductor;

part of the third portion is opposed to part of the third inductor;

the first to third capacitors are disposed at positions different from those of the first to third inductors in the stacking direction;

the second inductor is lower in inductance than the first and third inductors; and the second capacitor is higher in capacitance than the first and third capacitors.

2. The layered bandpass filter according to claim 1, wherein the first and third inductors are disposed on a same one of the plurality of dielectric layers.

3. The layered bandpass filter according to claim 1, further comprising a ground terminal disposed on an end face of the layered structure in the stacking direction, and a common conductive path for electrically connecting the first to third inductors to the ground terminal, wherein the first portion of the second inductor is connected to the common conductive path.

4. The layered bandpass filter according to claim 3, wherein the common conductive path is formed using through holes.

5. The layered bandpass filter according to claim 3, wherein the common conductive path is formed using a conductor layer disposed on the periphery of the layered structure.

6. A layered bandpass filter comprising:

a layered structure including a plurality of dielectric layers that are stacked;

an input terminal and an output terminal disposed on a periphery of the layered structure; and a first resonator, a second resonator, and a third resonator provided within the layered structure, wherein:

of the first to third resonators, the first resonator is located closest to the input terminal, the third resonator is located closest to the output terminal, and the second resonator is located between the first resonator and the third resonator, in terms of circuit configuration;

the first resonator includes a first inductor and a first capacitor;

the second resonator includes a second inductor and a second capacitor;

the third resonator includes a third inductor and a third capacitor;

the second inductor is disposed at a position different from that of each of the first and third inductors in a stacking direction of the plurality of dielectric layers;

no conductor layer is present between the second inductor and the first inductor and between the second inductor and the third inductor;

the first to third capacitors are disposed at positions different from those of the first to third inductors in the stacking direction;

the second inductor is lower in inductance than the first and third inductors;

the second capacitor is higher in capacitance than the first and third capacitors; and the second capacitor is formed using three or more conductor layers that are disposed at different positions in the stacking direction.

7. A layered bandpass filter comprising:

a layered structure including a plurality of dielectric layers that are stacked;

an input terminal and an output terminal disposed on a periphery of the layered structure; and a first resonator, a second resonator, and a third resonator provided within the layered structure, wherein:

of the first to third resonators, the first resonator is located closest to the input terminal, the third resonator is located closest to the output terminal, and the second resonator is located between the first resonator and the third resonator, in terms of circuit configuration;

the first resonator includes a first inductor and a first capacitor;

the second resonator includes a second inductor and a second capacitor;

the third resonator includes a third inductor and a third capacitor;

the second inductor is disposed at a position different from that of each of the first and third inductors in a stacking direction of the plurality of dielectric layers;

no conductor layer is present between the second inductor and the first inductor and between the second inductor and the third inductor;

the first to third capacitors are disposed at positions different from those of the first to third inductors in the stacking direction;

the second inductor is lower in inductance than the first and third inductors;

the second capacitor is higher in capacitance than the first and third capacitors; and the second resonator further includes a fourth inductor connected to the second capacitor in series.

* * * * *